(12) United States Patent
Okumura

(10) Patent No.: US 9,155,135 B2
(45) Date of Patent: Oct. 6, 2015

(54) DISPLAY DEVICE AND METHOD FOR MANUFACTURING DISPLAY DEVICE

(71) Applicant: JOLED INC., Tokyo (JP)

(72) Inventor: Hiroko Okumura, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/381,037

(22) PCT Filed: Nov. 8, 2012

(86) PCT No.: PCT/JP2012/007154
§ 371 (c)(1),
(2) Date: Aug. 26, 2014

(87) PCT Pub. No.: WO2013/157059
PCT Pub. Date: Oct. 24, 2013

(65) Prior Publication Data
US 2015/0022079 A1  Jan. 22, 2015

(30) Foreign Application Priority Data

Apr. 18, 2012  (JP) ................................ 2012-094541

(51) Int. Cl.
*H01J 1/62* (2006.01)
*H05B 33/04* (2006.01)
(Continued)

(52) U.S. Cl.
CPC ............ *H05B 33/04* (2013.01); *H01L 51/5246* (2013.01); *H01L 51/5253* (2013.01); *H05B 33/10* (2013.01)

(58) Field of Classification Search
CPC ....................................... B32B 27/08

USPC .......................................... 313/512, 498, 606
See application file for complete search history.

(56) References Cited

U.S. PATENT DOCUMENTS

| 2003/0173897 A1 | 9/2003 | Iwase et al. |
| 2014/0300270 A1 | 10/2014 | Sakamoto |

FOREIGN PATENT DOCUMENTS

| JP | 2003-203762 | 7/2003 |
| JP | 2005-332615 | 12/2005 |
| JP | 2006-185658 | 7/2006 |

(Continued)

OTHER PUBLICATIONS

U.S. Appl. No. 14/375,506 to Kazuyuki Yamae et al., filed Jul. 30, 2014.

(Continued)

*Primary Examiner* — Vip Patel
(74) *Attorney, Agent, or Firm* — Greenblum & Bernstein, P.L.C.

(57) ABSTRACT

A display device includes: an element substrate on which light-emitting elements are arranged, the light-emitting elements being arranged in a display region of the element substrate; a sealing resin layer located over the light-emitting elements arranged on the element substrate; and an opposite substrate located opposite the element substrate with the sealing resin layer therebetween. The sealing resin layer includes: a first sealing portion formed along an outer periphery of the display region so as to have a frame-like shape; a second sealing portion formed so as to cover the display region within the first sealing portion; and a dendritic portion being a branched extension of the second sealing portion that extends into the first sealing portion. A tip of the dendritic portion is located within an outer periphery of the first sealing portion.

19 Claims, 14 Drawing Sheets

(51) Int. Cl.
*H01L 51/52* (2006.01)
*H05B 33/10* (2006.01)

(56) References Cited

FOREIGN PATENT DOCUMENTS

| JP | 2007-073397 | 3/2007 |
| JP | 2009-266590 | 11/2009 |
| JP | 2010-244694 | 10/2010 |
| JP | 2011-034827 | 2/2011 |

OTHER PUBLICATIONS

U.S. Appl. No. 14/396,211 to Takashi Osako, filed Oct. 22, 2014.

International Search Report (ISR) in International Patent Application No. PCT/JP2012/007154, dated Feb. 5, 2013.

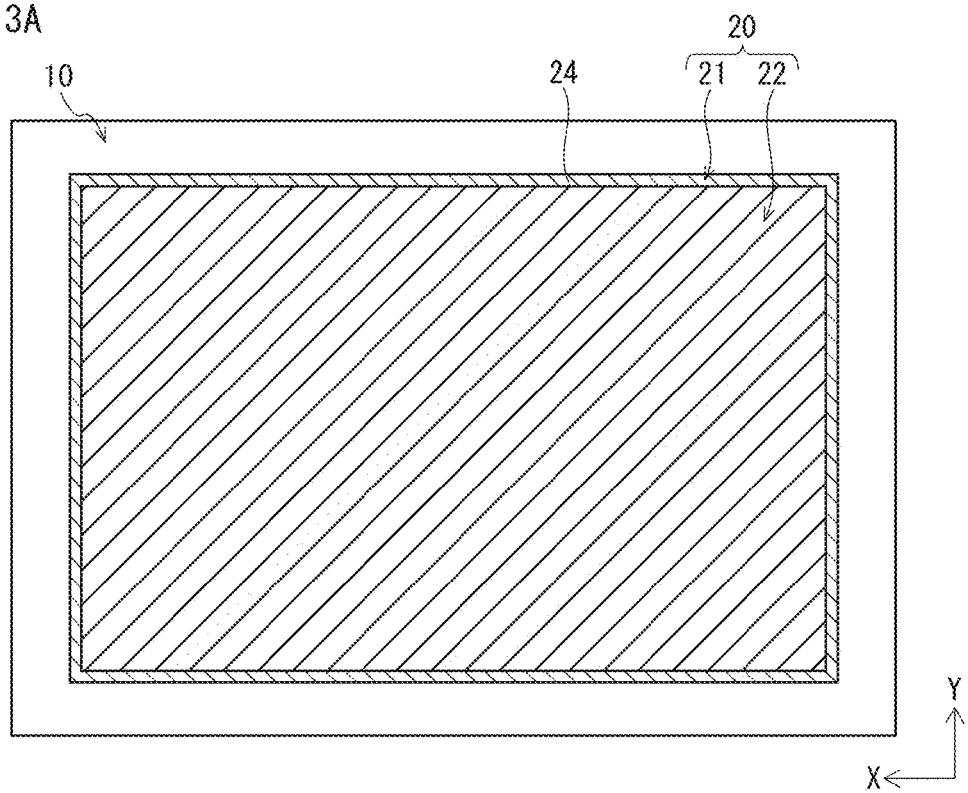
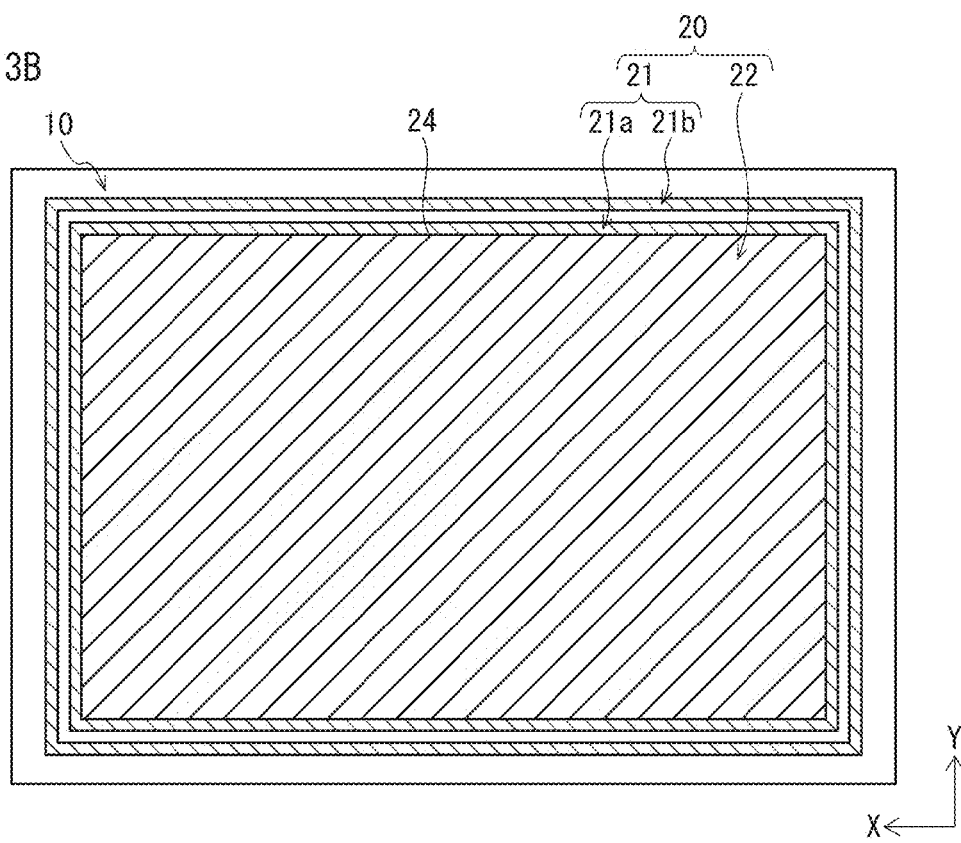

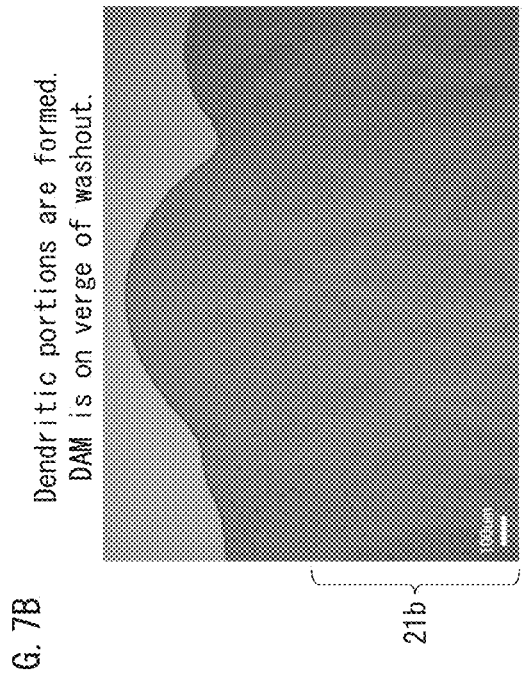
FIG. 7A Joining after lapse of 5 min. (17% of pot life) from UV irradiation
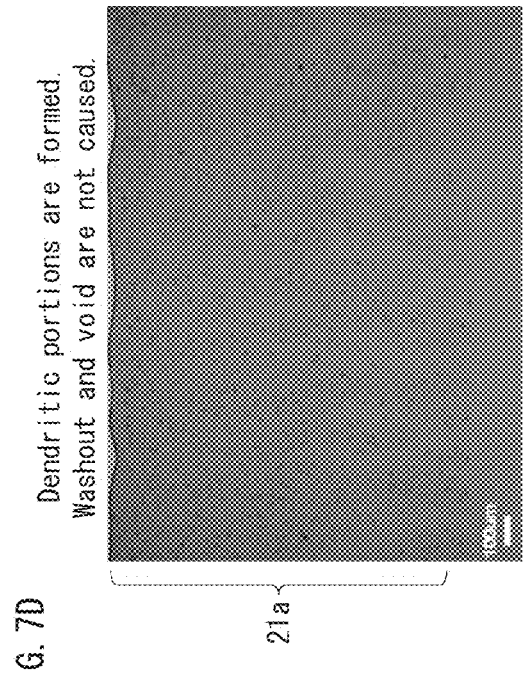
FIG. 7B Dendritic portions are formed. DAM is on verge of washout.
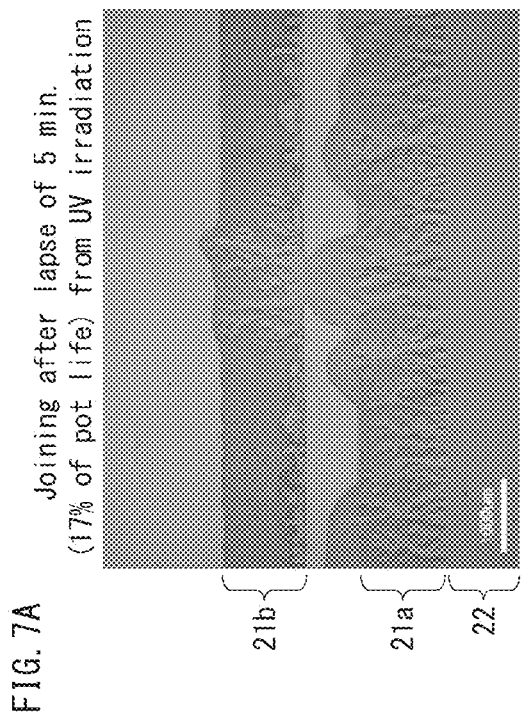
FIG. 7C Joining after lapse of 9 min. (30% of pot life) from UV irradiation
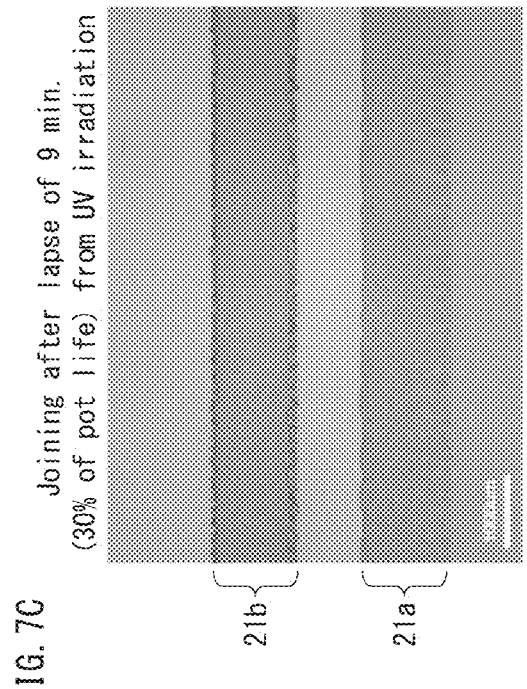
FIG. 7D Dendritic portions are formed. Washout and void are not caused.

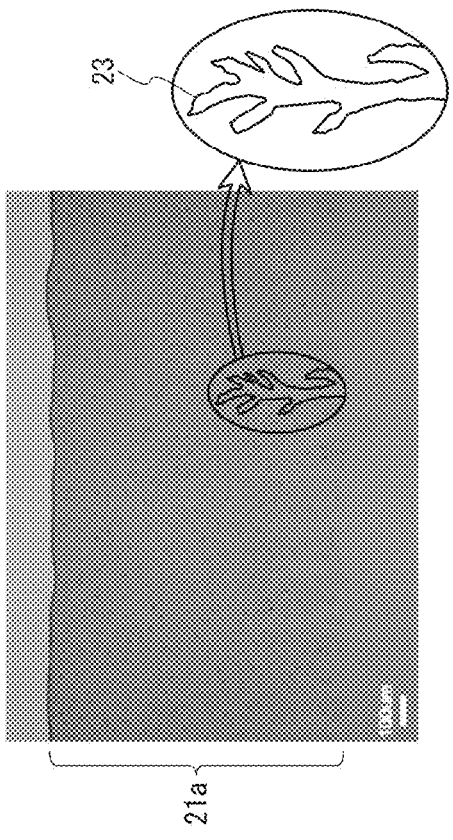
FIG. 8A Joining after lapse of 18 min. (60% of pot life) from UV irradiation
FIG. 8B Dendritic portions are formed. Washout and void are not caused.
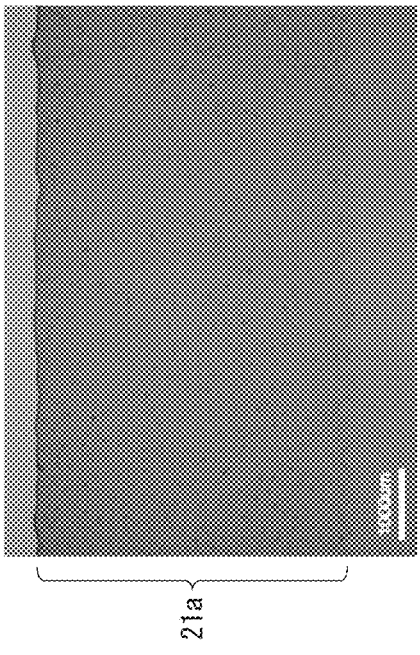
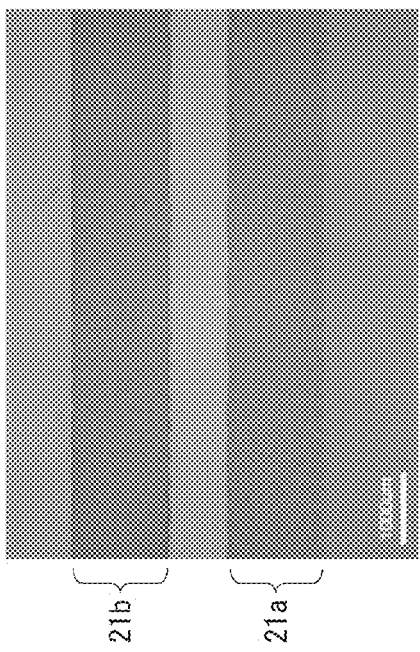
FIG. 8C Joining after lapse of 21 min. (70% of pot life) from UV irradiation
FIG. 8D No dendritic portion is formed. Void is produced in FILL.
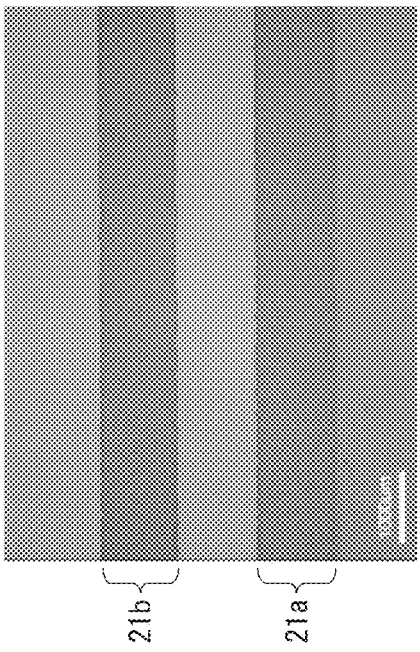

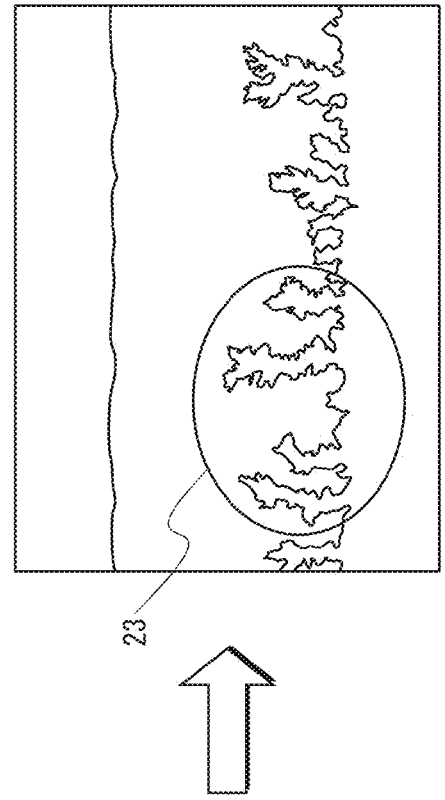
FIG. 9A Level 5: pot life DAM 10 min. FILL 30 min.
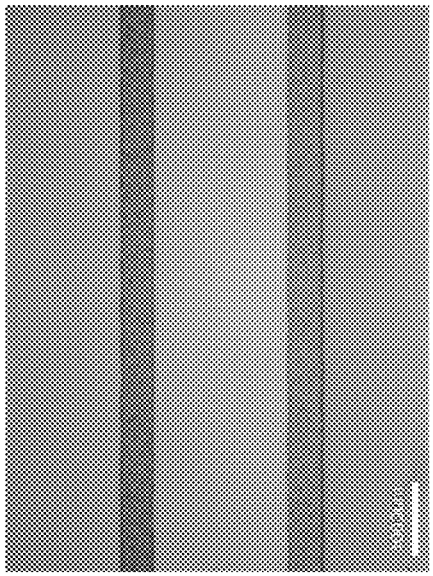
FIG. 9C Dendritic portions are formed. Washout and void are not caused.
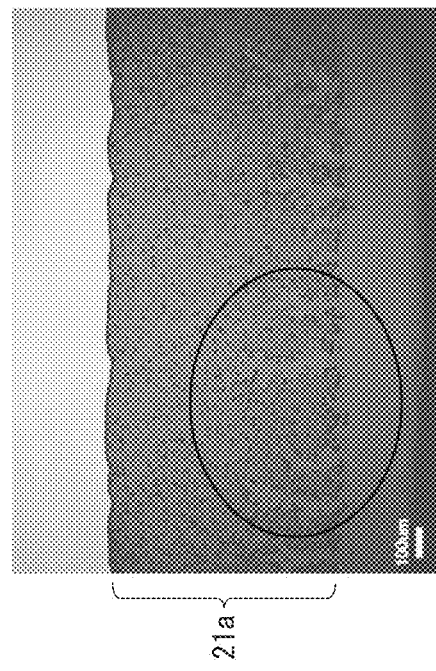
FIG. 9B DAM 10 min. FILL 30 min. Joining after lapse of 8 min.
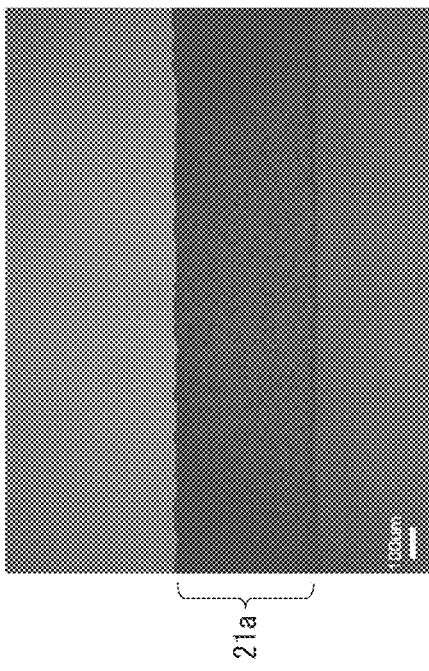

Level 1: pot life DAM 10 min. FILL 10 min.

Level 2: pot life DAM 20 min. FILL 20 min.
Inner DAM is on verge of washout.

DISPLAY DEVICE AND METHOD FOR MANUFACTURING DISPLAY DEVICE

TECHNICAL FIELD

The present invention relates to a display panel including an element substrate, an opposite substrate, and a sealing resin layer between the element substrate and the opposite substrate, and to a method for manufacturing the display panel.

BACKGROUND ART

In a typical display device such as an organic EL display device, a plurality of light-emitting elements are arranged in a display region of an element substrate.

Light-emitting elements, including organic EL elements, deteriorate easily due to moisture and oxygen entering from the outside. In Patent Literature 1, for example, deterioration of the light-emitting elements is prevented by providing an opposite substrate located opposite an element substrate, and sealing the light-emitting elements with a sealing resin layer located between the element substrate and the opposite substrate.

One method used as a method for joining the element substrate and the opposite substrate together via the sealing resin layer is a method of superimposing the element substrate, the opposite substrate, and a liquid sealant or a sheet thermoplastic sealant so that the sealant is located between the element substrate and the opposite substrate, and curing the sealant.

As disclosed in Patent Literature 2, curing of the sealant is initiated by heat or UV light irradiation, for example.

CITATION LIST

Patent Literature

[Patent Literature 1]
Japanese Patent Application Publication No. 2010-244694
[Patent Literature 2]
Japanese Patent Application Publication No. 2007-73397

SUMMARY OF INVENTION

Technical Problem

As mentioned above, the light-emitting elements deteriorate easily due to moisture and oxygen entering from the outside. Therefore, it is preferable to increase sealing properties of the sealant in the display device including the element substrate and the opposite substrate joined together via the sealing resin layer.

Solution to Problem

One aspect of the present invention is a display device including: an element substrate on which light-emitting elements are arranged, the light-emitting elements being arranged in a display region of the element substrate; a sealing resin layer located over the light-emitting elements arranged on the element substrate; and an opposite substrate located opposite the element substrate with the sealing resin layer therebetween, wherein the sealing resin layer includes: a first sealing portion along an outer periphery of the display region, the first sealing portion having a frame-like shape; a second sealing portion within the first sealing portion, the second sealing portion covering the display region; and a dendritic portion being a branched extension of the second sealing portion that extends into the first sealing portion, and a tip of the dendritic portion is located within an outer periphery of the first sealing portion.

Advantageous Effects of Invention

Since the dendritic portion, which is the extension of the second sealing portion, extends into the first sealing portion, the bonding strength between the first sealing portion and the second sealing portion is increased, and stress put on the sealing portions is distributed.

The tip of the dendritic portion is located within the outer periphery of the first sealing portion, so that the dendritic portion does not penetrate through the first sealing portion. This structure prevents moisture and oxygen from entering from the outside (from the outer periphery of the first sealing portion) into the region in which the light-emitting elements are formed.

Reduction of sealing properties of the sealing resin layer can thus be suppressed.

BRIEF DESCRIPTION OF DRAWINGS

FIGS. 3A and 3B are plan views showing locations of sealing portions in the display panel 10.

FIGS. 7A, 7B, 7C, and 7D are photographs showing results of Experiment 1.

FIGS. 8A, 8B, 8C, and 8D are photographs and an illustration showing results of Experiment 1.

FIGS. 9A, 9B, and 9C are photographs and an illustration showing results of Experiment 1.

DESCRIPTION OF EMBODIMENT

Aspects of Invention

Figure 1:
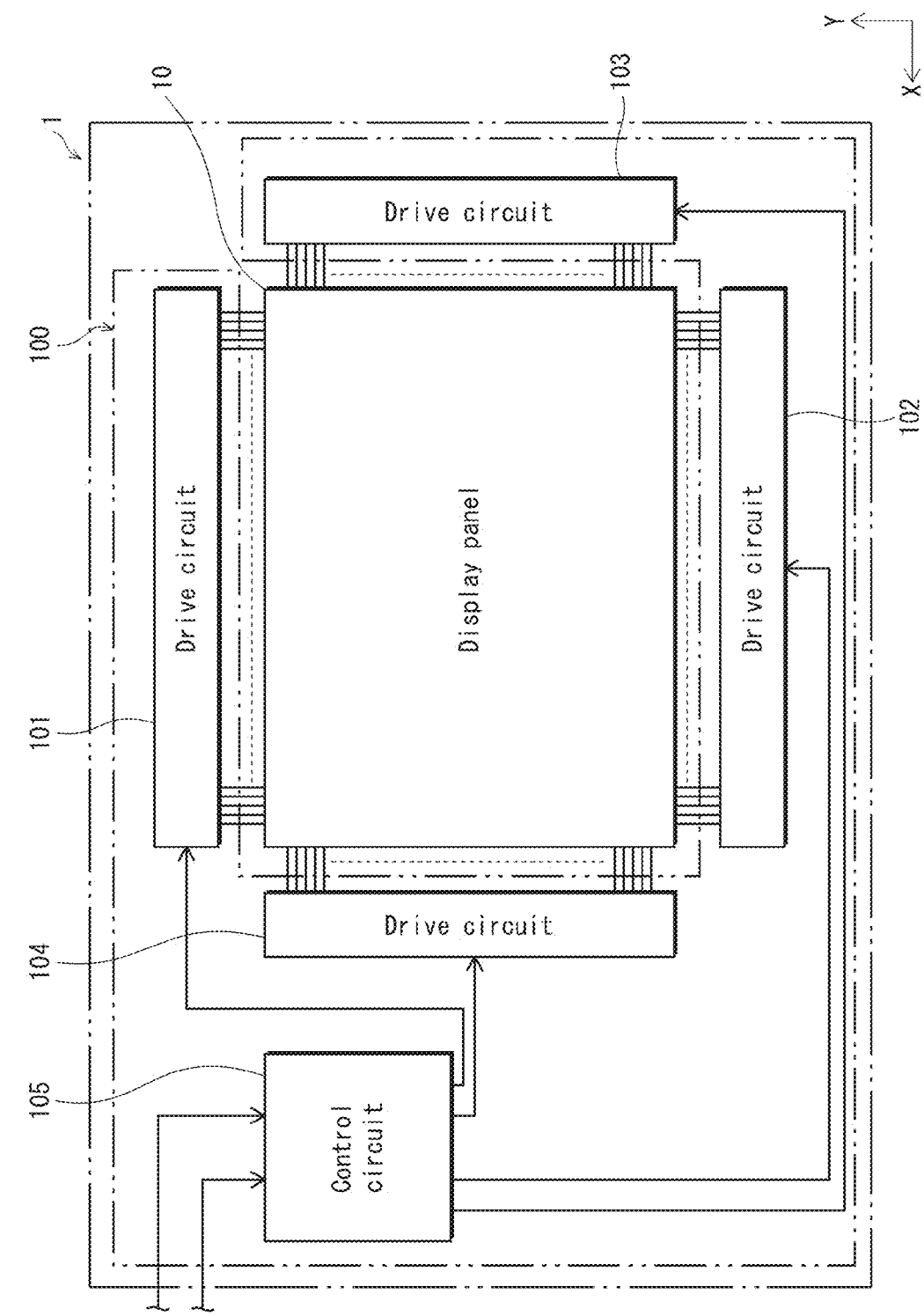
FIG. 1 is a block diagram schematically showing the overall structure of a display device according to an embodiment.

In a display device pertaining to one aspect of the present invention, the sealing resin layer includes a first sealing portion formed along an outer periphery of the display region so as to have a frame-like shape and a second sealing portion formed so as to cover the display region within the first sealing portion. In this display device, sealing properties are increased by the presence of the first sealing portion enclosing the second sealing portion.

Stress can be caused between the first sealing portion and the second sealing portion. The stress can produce a void between the first sealing portion and the second sealing portion. When another sealing film is interposed between the first sealing portion and the element substrate or between the first sealing portion and the opposite substrate, the stress can reduce adhesion of the first sealing portion to the other sealing film at or around an interface between the first sealing portion and the second sealing portion, and, in some cases, can cause separation of the other sealing film.

Such a void and separation can reduce sealing properties of the sealing resin layer.

To address the problem, the display device pertaining to the aforementioned aspect includes the dendritic portion being the branched extension of the second sealing portion that extends into the first sealing portion. The dendritic portion is formed by the second sealing portion entering into the first sealing portion while branching. That is to say, the first sealing portion and the second sealing portion are interlocked with each other at or around the interface therebetween, and thus the bonding strength between the first sealing portion and the second sealing portion is increased by the anchor effect. Thus, reduction of the sealing properties of the sealing resin layer caused by the stress between the first sealing portion and the second sealing portion can be suppressed.

Further, since the tip of the dendritic portion is located within the outer periphery of the first sealing portion, reduction of the sealing properties of the sealing resin layer can be reduced.

The following structures may be applied to the display device pertaining to the aforementioned aspect.

The first sealing portion may be made of a first sealant, the second sealing portion may be made of a second sealant, and the first sealant and the second sealant each may contain a resin material as a major component.

The first sealing portion may be obtained by applying and curing the first sealant, and the second sealing portion may be obtained by applying and curing the second sealant.

The first sealing portion may include: an inner frame part enclosing an outer periphery of the second sealing portion; and an outer frame part enclosing an outer periphery of the inner frame part. By forming the first sealing portion as two frames as described above, the sealing effects can be improved compared to a case where the sealing portion is formed as only one of the two frames.

When the first sealing portion is formed as two frames, and the dendritic portion extends into the inner frame part and the tip of the dendritic portion is located within the outer periphery of the inner frame part, the sealing properties of the first sealing portion are doubly maintained without causing washout of the inner frame part and the outer frame part. Sealing performance is maintained more in a case where washout of the outer frame part and the inner frame part made of the first sealant is not caused than in a case where washout of one of the outer frame part and the inner frame part is caused. When the dendritic portion reaches the outer periphery of the inner frame part and a material for the second sealing portion extends into a region between the inner frame part and the outer frame part, or when the dendritic portion extends into the outer frame part and the tip of the dendritic portion is located within an outer periphery of the outer frame part, reduction of the sealing properties can be suppressed as washout of the outer frame part is not caused.

In the present description, a portion of the substrate closer to an edge than the center (or the center of gravity) of substrate is referred to as an outer peripheral portion, and a portion of the substrate closer to the center than the edge of the substrate is referred to as an inner peripheral portion.

Further, in the present description, the term "washout" means that a particular material reaches an outer periphery of the sealant located on the outer peripheral portion of the substrate, or that the particular material penetrates the outer periphery of the sealant and flows out of the sealant located on the outer peripheral portion of the substrate.

In order to improve the sealing effects of the first sealing portion, it is preferable that a time from a start of energy impartation until viscosity of the first sealant before energy impartation is doubled (this time to hardening (polymerization) is referred to as a "pot life" in the present description) be shorter than or approximately equal to a time from the start of energy impartation until viscosity of the second sealant before energy impartation is doubled.

The opposite substrate may include a color filter in a region corresponding to the display region.

A method for manufacturing a display device pertaining to another aspect of the present invention is a method for manufacturing a display device, the method including: applying, to one of the element substrate and the opposite substrate, a first sealant so as to form a frame along an outer periphery of a display region, and a second sealant in a region within the first sealant; curing the first sealant and the second sealant by imparting energy; and joining the element substrate and the opposite substrate together via the first sealant and the second sealant so that the element substrate and the opposite substrate are located opposite each other with the first sealant and the second sealant therebetween, wherein a time from a start of energy impartation to joining of the element substrate and the opposite substrate is longer than 17% and equal to or shorter than 60% of a time from the start of energy impartation until viscosity of one of the first sealant and the second sealant before energy impartation is doubled.

According to the method, the dendritic portion which is the branched extension of the second sealing portion that extends into the first sealing portion and whose tip is located within the outer periphery of the first sealing portion can be formed while suppressing production of a void between the first sealing portion and the second sealing portion.

The dendritic portion increases the bonding strength between the first sealing portion and the second sealing portion by the anchor effect. Reduction of the sealing properties of the sealing resin layer can thus be suppressed. In addition, since the tip of the dendritic portion is located within the outer periphery of the first sealing portion, reduction of the sealing properties of the sealing resin layer can further be suppressed.

It is preferable that the time from the start of energy impartation to joining of the element substrate and the opposite substrate be equal to or longer than 30% of the time from the start of energy impartation until the viscosity of said one of the first sealant and the second sealant before energy impartation is doubled.

When two frame parts are formed by using the first sealant 210, the sealing properties of the sealing resin layer are maintained to be high by forming the dendritic portion such that the tip of the dendritic portion is located within the outer periphery of the inner frame part.

In order to improve the sealing effects of the first sealing portion, it is preferable that the time from the start of energy impartation until viscosity of the first sealant before energy impartation is doubled (pot life) be shorter than or approximately equal to the time from the start of energy impartation until viscosity of the second sealant before energy impartation is doubled.

In applying the first sealant and the second sealant, it is preferable to apply the second sealant after application of the first sealant.

In applying the first sealant and the second sealant, it is preferable to apply the first sealant and the second sealant so as not to come into contact with each other. If the second sealant comes into contact with the first sealant immediately after application of the first sealant, the second sealant is likely to seep out of the first sealant as a degree of cure of the first sealant is extremely low. By applying the first sealant and the second sealant such that the first sealant and the second sealant do not come into contact with each other, the second sealant is prevented from seeping out of the first sealant.

The effect of preventing the second sealant from seeping out of the first sealant is increased by applying the first sealant and the second sealant so that the first sealant and the second sealant do not come into contact with each other before joining of the element substrate and the opposite substrate.

In applying the first sealant and the second sealant, it is preferable to apply the first sealant so as to form at least two concentric frames. Compared to a case where the first sealant is applied so as to form a single frame, the sealing properties of the first sealing portion are increased. As a result, oxygen and moisture become less likely to enter into a gap between the element substrate and the opposite substrate, thereby suppressing deterioration of performance of the light-emitting elements.

The following describes the display panel according to an embodiment with reference to the drawings. The embodiment described below, however, is a mere preferred embodiment. The present invention is not limited to the embodiment described below, and the embodiment described below may be modified as appropriate within a scope not departing from the technical idea of the present invention. The embodiment described below may also be combined with any other embodiment within a scope not causing inconsistency.

Embodiment

1. Overall Structure

The overall structure of a display device 1 according to the present embodiment is described below with use of the drawings.

FIG. 1 is a block diagram schematically showing the overall structure of the display device 1.

As shown in FIG. 1, the display device 1 includes a display panel 10 and a drive control unit 100 connected to the display panel 10.

The display panel 10 is for example a top-emission type organic EL display panel making use of electroluminescence in organic materials. The drive control unit 100 includes four drive circuits 101-104 and a control circuit 105 that controls the four drive circuits 101-104.

Figure 15:
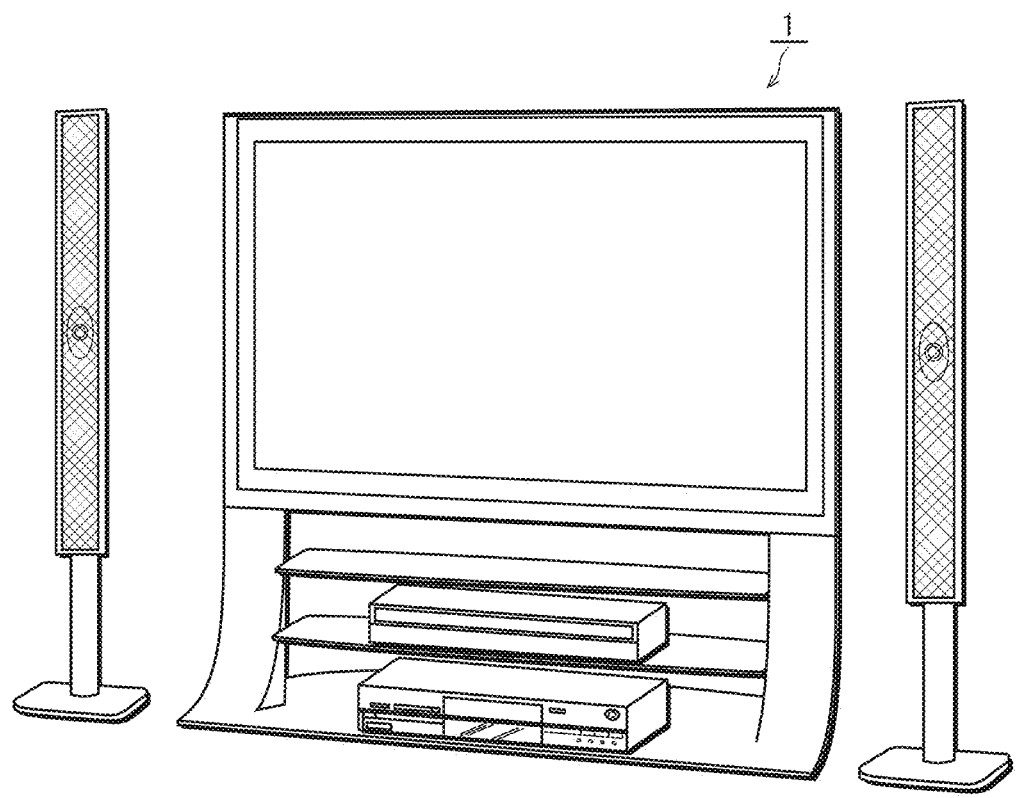
FIG. 15 shows a display device including a display panel according to an embodiment.

FIG. 15 shows an appearance of one example of a television system including the display device 1.

2. Structure of Display Panel 10

The following describes the structure of the display panel 10 in detail.

Figure 2:
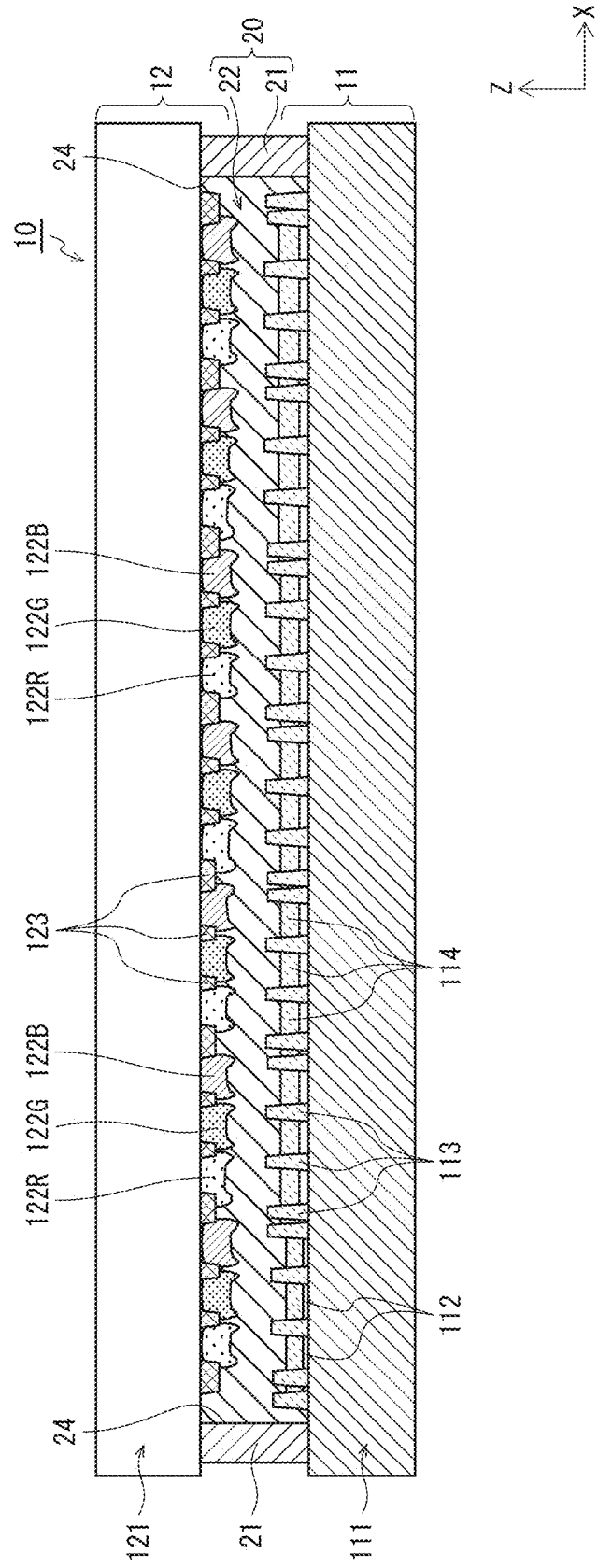
FIG. 2 is a sectional view schematically showing a principal part of a display panel 10.

FIG. 2 is a sectional view schematically showing a principal part of the display panel 10 according to the embodiment.

In FIGS. 1 and 2, horizontal and vertical directions of the display panel 10 are respectively X and Y directions, and a direction perpendicular to each of the X and Y directions and extending forward from the plane of FIG. 1 is a Z direction.

The display panel 10 emits light forward (in the Z direction).

As shown in FIG. 2, the display panel 10 has a structure in which an EL substrate (i.e., the "element substrate") 11 and a CF substrate (i.e., the "opposite substrate") 12 are located opposite each other with a sealing resin layer 20 therebetween.

The sealing resin layer 20 serves to bond the EL substrate 11 and the CF substrate 12 together and to prevent moisture and gas from entering from the outside of the display panel 10 into light-emitting elements arranged on the EL substrate 11.

In a display region of the display panel 10, top-emission type organic EL elements corresponding to respective R, G, and B colors are arranged adjacent to each other in a matrix, so that color images are displayed on a top surface of the CF substrate. Each of the organic EL elements corresponds to a subpixel, and subpixels of respective three colors constitute a single pixel.

Each subpixel is long in the Y direction. The subpixels of the respective three colors are arranged in the X direction so that each pixel has an approximately square shape in plan view.

(1) EL Substrate 11

The EL substrate 11 is formed by sequentially stacking, on a front surface of a TFT substrate 111, anodes 112, auxiliary electrodes (not illustrated), banks 113, light-emitting layers 114, a cathode (not illustrated), and a thin-film sealing layer (not illustrated).

The above-mentioned TFT substrate 111 is formed by providing a plurality of TFT elements on a substrate body, and providing an interlayer insulation film over top surfaces of the TFT elements. The substrate body is made, for example, of an insulating material such as alkali-free glass, soda glass, non-fluorescent glass, phosphate glass, borate glass, quartz, an acrylic resin, a styrenic resin, a polycarbonate resin, an epoxy resin, polyethylene, polyester, a silicone resin, and alumina, or an organic resin film. The interlayer insulation film is made, for example, of an insulating material such as a polyimide resin and an acrylic resin.

The anodes 112 are provided independently for respective subpixels, and the banks 113 are formed between adjacent subpixels.

The anodes 112 and the auxiliary electrodes are each metal wiring, and are made, for example, of aluminum (Al) or an aluminum alloy. The anodes 112 and the auxiliary electrodes each may be made of silver (Ag), an alloy of silver, palladium, and copper, and an alloy of silver, rubidium, and gold, an alloy of molybdenum and chromium (MoCr), and an alloy of nickel and chromium (NiCr).

Since the display panel 10 is of a top-emission type, the anodes 112 are made of a highly light-reflective material.

The banks 113 are made of an insulating material, and, specifically, of an organic material such as a resin. The banks 113 protrude forward so as to partition the light-emitting layers 114, and have a trapezoidal cross-section. Examples of a material for the banks 113 are an acrylic resin, a polyimide resin, and a novolac type phenolic resin.

The light-emitting layers 114 are organic layers each emitting light of a predetermined color, and are formed between adjacent banks 113.

The light-emitting layers 114 are made, for example, of a fluorescent material such as an oxinoid compound, a perylene compound, a coumarin compound, an azacoumarin compound, an oxazole compound, an oxadiazole compound, a perinone compound, a pyrrolo-pyrrole compound, a naphthalene compound, an anthracene compound, a fluorene compound, a fluoranthene compound, a tetracene compound, a pyrene compound, a coronene compound, a quinolone compound and an azaquinolone compound, a pyrazoline derivative and a pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylene pyran compound, a dicyanomethylene thiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, a cyanine compound, an acridine compound, a metal complex of a 8-hydroxyquinoline compound, a metal complex of a 2-bipyridine compound, a complex of a Schiff base and a group three metal, a metal complex of oxine, and a rare earth metal complex.

The cathode and the sealing layer are continuously formed over the light-emitting layers 114 and the banks 113.

The cathode is a so-called transparent electrode, and is made, for example, of indium tin oxide (ITO) and indium zinc oxide (IZO).

The thin-film sealing layer is a thin film made, for example, of a material such as silicon oxide (SiO), silicon nitride (SiN), silicon oxynitride (SiON), silicon carbide (SiC), carbon-containing silicon oxide (SiOC), aluminum nitride (AlN), and aluminum oxide ($Al_2O_3$). In a case of a bottom-emission type display panel, the anodes may not be made of the highly light-reflective material, and the cathode may not be the transparent electrode, as described later.

(2) CF Substrate 12

The CF substrate 12 is formed by arranging color filters 122R, 122G, and 122B and a black matrix (hereinafter, referred to as a "BM") 123 on a back surface of a transparent substrate 121 made of a light-transmissive material.

The transparent substrate 121 is a substrate made of a similar material to the substrate body of the aforementioned TFT substrate 111, for example.

The color filters 122R, 122G, and 122B are made of resin materials, such as polyimide materials, that allow passage of visible light having wavelength ranges corresponding to red, green, and blue, respectively. The color filters 122R, 122G, and 122B are arranged so as to correspond to locations of the respective light-emitting layers 114 arranged on the EL substrate 11.

The BM 123 is made, for example, of an ultraviolet curable resin material containing black pigment having excellent light absorption and light blocking properties. The BM 123 is formed so as to be located opposite the banks 113 of the EL substrate 11. The BM 123 is formed in a lattice pattern so as to partition the color filters 122R, 122G, and 122B. The BM 123 has a function to improve display contrast.

(3) Sealing Resin Layer 20

The EL substrate 11 and the CF substrate 12 described above are located opposite each other with the sealing resin layer 20 therebetween.

The EL substrate 11 and the CF substrate 12 are located so that locations of the subpixels R, G, and B of the organic light-emitting layers of the EL substrate 11 correspond to locations of the respective color filters R, G, and B of the CF substrate 12, and locations of the banks 113 of the EL substrate 11 correspond to a location of the BM of the CF substrate 12.

FIGS. 3A and 3B are plan views showing locations where the sealing resin layer 20 is formed in the display panel 10.

The sealing resin layer 20 includes a first sealing portion (also referred to as "DAM" or "sealant") 21 and a second sealing portion (also referred to as "FILL" or "filler") 22. The first sealing portion 21 is formed outside the display region so as to form a frame. The second sealing portion 22 is formed in the display region within the first sealing portion 21.

The sealing resin layer 20 is made, for example, of an acrylic resin, an epoxy resin, and a silicone resin that are each curable.

The first sealing portion 21 is made of a material having a higher modulus of elasticity than the second sealing portion 22. For example, modulus of elasticity of the first sealing portion 21 is 4 GPa, and modulus of elasticity of the second sealing portion 22 is 2 GPa.

In each of FIGS. 3A and 3B, a region in which the second sealing portion 22 is formed approximately matches the display region of the display panel 10.

FIGS. 4A, 4B, 4C, and 4D are schematic diagrams each showing an enlarged view of a portion of the sealing resin layer 20 of the display panel 10 at or around a boundary 24 between the first sealing portion 21 and the second sealing portion 22. In each of FIGS. 4A, 4B, 4C, and 4D, an upper side of the drawing corresponds to an outside of the display panel 10, and a lower side of the drawing corresponds to an inside of the display panel 10.

Figure 4A:
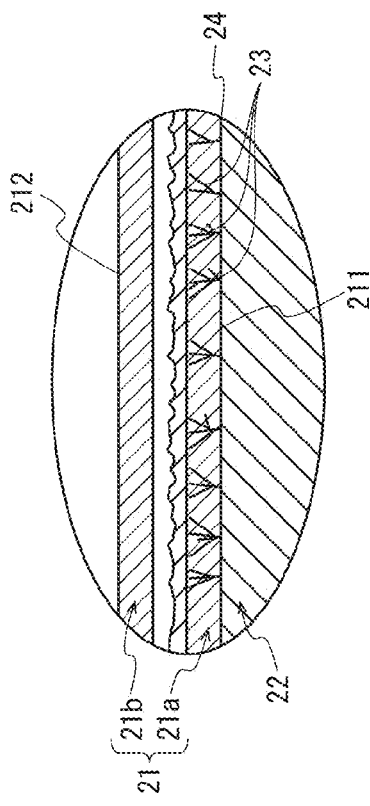
FIGS. 4A, 4B, 4C, and 4D are schematic diagrams each showing an enlarged view of a portion of a sealing resin layer 20 included in the display panel 10 at or around a boundary 24 between a first sealing portion 21 and a second sealing portion 22.

FIG. 4A shows an example in which the first sealing portion 21 is formed as a single frame.

Figure 4B:
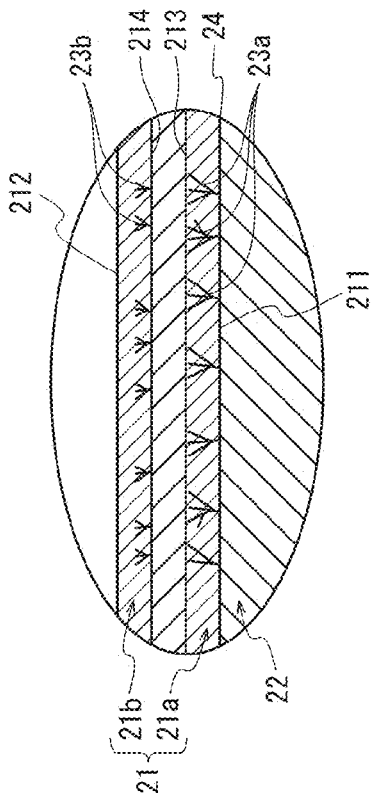
Figure 4C:
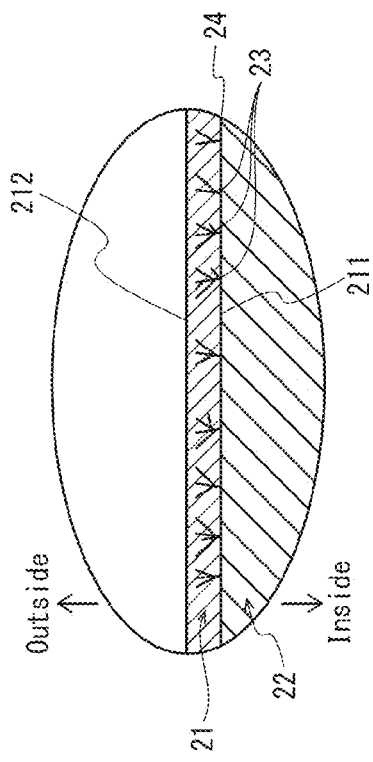
Figure 4D:
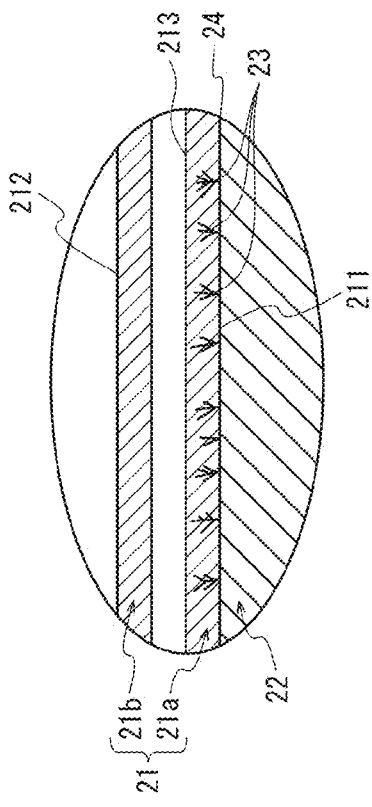

FIGS. 3B and 4B-4D each show an example in which the first sealing portion 21 is formed as two frames, that is, the first sealing portion 21 is composed of an inner frame part 21a enclosing, an outer periphery of the second sealing portion 22, and an outer frame part 21b enclosing an outer periphery of the inner frame part 21a. As shown in FIGS. 4B-4D, forming the first sealing portion 21 as two frames can prevent moisture and oxygen from entering into the second sealing portion 22, and can increase sealing effects of the first sealing portion 21.

As shown in FIGS. 4A-4D, dendritic portions 23 are formed in the first sealing portion 21. The dendritic portions 23 are each a branched extension of the second sealing portion 22 that extends into the first sealing portion 21 from an inner periphery 211 of the first sealing portion 21. Tips of the dendritic portions 23 do not reach an outer periphery 212 of the first sealing portion 21, and are located within the outer periphery 212.

Degrees of entry of the dendritic portions 23 into the inner frame part 21a and the outer frame part 21b differ among FIGS. 4B, 4C, and 4D as described below.

In FIG. 4B, the dendritic portions 23 extends from the inner periphery 211 of the first sealing portion 21 into the inner frame part 21a, and tips of the dendritic portions 23 do not reach an outer periphery 213 of the inner frame part 21a.

The second sealing portion 22 penetrates through neither the inner frame part 21a nor the outer frame part 21b of the first sealing portion 21. As a result, the second sealing portion 22 is sealed by two frames, and high sealing properties can be obtained. Note that a situation in which the second sealing portion 22 penetrates an outermost peripheral surface of the first sealing portion 21 and flows out of the first sealing portion 21 is hereinafter referred to as "washout". Similarly, a situation in which the first sealing portion 21 includes the inner frame part 21a and the outer frame part 21b, and the second sealing portion flows out of the inner frame part 21a and the outer frame part 21b is also referred to as the "washout". When the second sealing portion flows out of the inner frame part 21a and the outer frame part 21b, the outer periphery of each of the inner frame part 21a and the outer frame part 21b is hardly visible in some cases. The second sealing portion is less likely to reach corners of the first sealing portion (in a case where the first sealing portion is formed as a frame, ends of respective sides of the frame). Thus, the outer periphery of the first sealing portion may be defined as straight lines connecting two adjacent vertex angles of the first sealing portion, which has a frame-like shape. Similarly, the outer periphery of the inner frame part may be defined as straight lines connecting two adjacent vertex angles of the inner frame part.

In FIG. 4C, the dendritic portions 23 penetrate through the inner frame part 21a, and a material for the second sealing portion 22 extends into a region between the inner frame part 21a and the outer frame part 21b. In FIG. 4D, dendritic portions 23a penetrate through the inner frame part 21a, and the material for the second sealing portion 22 extends into the region between the inner frame part 21a and the outer frame part 21b. Further, the material for the second sealing portion 22 extends from an inner periphery 214 of the outer frame part 21b into the outer frame part 21b to form dendritic portions 23b. In FIGS. 4C and 4D, tips of the dendritic portions 23 are located within the outer periphery of the outer frame part 21b, and thus entry of air from the outside of the outer frame part 21b into a region in which the light-emitting elements are formed can be prevented. In FIG. 4A, tips of the dendritic portions 23 also do not reach the outer periphery 212 of the first sealing portion 21, and are located within the outer periphery 212. Therefore, similar effects can be produced. Further, in FIG. 4B, washout of the inner frame part 21a and the outer frame part 21b is not caused. Compared to a case where washout of the outer frame part 21b is not caused but washout of the inner frame part 21a is caused (e.g., a case in each of FIGS. 4C and 4D), sealing performance of the first sealing portion 21 is less likely to deteriorate.

3. Method for Manufacturing Display Panel 10

The display panel 10 is manufactured through (1) a process of preparing the EL substrate 11, (2) a process of preparing the CF substrate 12, and (3) a process of joining the EL substrate 11 and the CF substrate 12 together. Each of the processes is described below.

(1) EL Substrate 11 Preparing Process

The following describes a process of manufacturing the EL substrate 11.

First, the interlayer insulation film is formed on the TFT substrate. Then, a metal thin film for forming the anodes and the auxiliary electrodes is formed on a top surface of the interlayer insulation film, and is patterned to obtain the anodes 112 and the auxiliary electrodes. The metal thin film is formed by sputtering, and is patterned by photolithography, for example.

Next, a bank material layer for forming the banks made of an insulating organic material is formed, and is patterned to obtain the banks 113. The bank material layer is formed, for example, by application, and is patterned, for example, by overlaying a mask having openings of a predetermined shape, exposing the bank material layer covered with the mask to light, and washing an extra portion of the bank material layer with developer (wet process).

After formation of the banks, organic light-emitting layers are formed in regions partitioned by the banks. The organic light-emitting layers are formed by dropping ink composition containing an organic EL material by an inkjet method, and drying the ink, for example.

The cathode is then formed so as to cover top surfaces of the banks and the organic light-emitting layers, and the sealing layer is further formed over the cathode. As a result, the EL substrate 11 is manufactured.

The cathode is formed, for example, by sputtering, and the sealing layer is formed, for example, by sputtering, chemical vapor deposition (CVD), and atomic layer deposition (ALD).

(2) CF Substrate 12 Preparing Process

The following describes a process of manufacturing the CF substrate 12.

First, a BM paste is adjusted by dispersing, in solvent, a BM material containing an ultraviolet curable resin (e.g. ultraviolet curable acrylic resin) material as its major component and black pigment, and the BM paste as adjusted is applied to one surface (top surface) of the transparent substrate 121.

The BM paste as applied is dried. When the solvent is volatilized to such an extent that the shape of the BM paste is maintained, a mask pattern having openings of a predetermined shape is overlaid on the BM paste so as to correspond to the locations of the banks.

The BM paste on which the mask pattern is overlaid is irradiated with ultraviolet light, and then the BM paste is baked. The mask pattern and an uncured portion of the BM paste are removed, and a remaining portion of the BM paste is developed and cured. As a result, the BM corresponding to the locations of the banks is completed.

Next, a filter paste R is applied to a surface of the transparent substrate 121 on which the BM has been formed. The filter paste R is prepared by dispersing, in solvent, a material for the color filter R containing an ultraviolet curable resin component as its major component. After the solvent is removed to some extent, a predetermined mask pattern is placed on the filter paste R, and the filter paste R on which the mask pattern is placed is irradiated with ultraviolet light.

The filter paste R on which the mask pattern is placed is then cured, and, after removing the mask pattern and an uncured portion of the filter paste R, developing is performed. As a result, the color filter R is formed. By repeating a similar process for each of materials for the color filters G and B, the color filters G and B are formed.

As a result, the color filters of the respective colors are formed so as to correspond to the locations of the organic light-emitting layers, and the CF substrate 12 is prepared.

The color filters R, G, and B are formed along the BM such that each color filter is partially located on top faces of edges of adjacent portions of the BM.

(3) Joining Process

FIGS. 5A, 5B, 5C, and 5D show one example of a joining process.

The joining process of joining the EL substrate 11 and the CF substrate 12 together includes: a process of applying a first sealant 210 as a material for the first sealing portion 21 and a second sealant 220 as a material for the second sealing portion 22 to a surface of the CF substrate 12; a process of initiating curing of the sealants; and a process of superimposing the EL substrate 11 on the CF substrate 12 on which the sealants are applied. Curing of the sealants progresses even in a state where the EL substrate 11 is superimposed on the CF substrate 12.

The following describes a pot life of each of the first sealant 210 and the second sealant 220.

A reaction initiator contained in a resin reacts to UV irradiation, and then curing reaction of each of the sealants is initiated. After the reaction is initiated, viscosity of the sealant increases as the reaction progresses.

Here, a time from a start of energy impartation until viscosity of the sealant before energy impartation is doubled is referred to as the pot life of the sealant.

The pot life can be adjusted, for example, by selecting the type of resin used in the sealant. The pot life can also be adjusted by varying the amount of retarder mixed in the resin.

<Application of First Sealant 210>

The first sealant (DAM) 210, which is a paste material for forming the first resin portion 21, is applied so as to form a frame along an outer periphery of the display region on a surface of the CF substrate 12.

The first sealant 210 is made, for example, of an UV curable acrylic resin, an UV curable epoxy resin, and a thermosetting epoxy resin. The first sealant 210 has a viscosity at the time of application (an initial viscosity) of 100,000 mPa·s to 1,000,000 Pa·s.

The first sealant 210 is applied by using a dispenser so as to draw a closed loop with a width of 200 um to 500 um and a height of 30 um to 80 um.

In the present embodiment, an UV curable epoxy resin having a viscosity of 500,000 Pa·s is used as the first sealant 210.

The first sealant is applied so as to have a cross section of 5000 $\mu m^2$ to 20000 $\mu m^2$, for example.

Figure 5A:
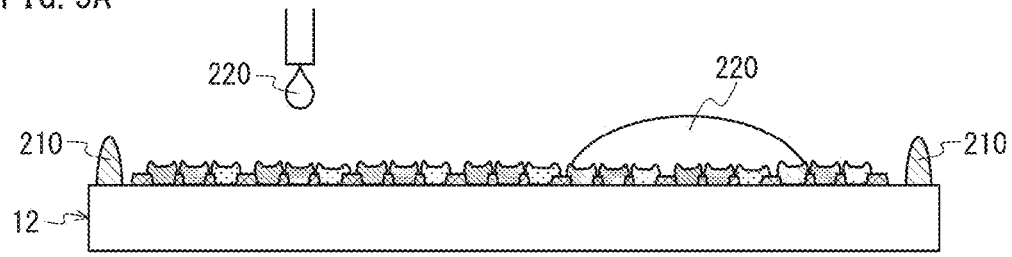
FIGS. 5A, 5B, 5C, and 5D show one example of a joining process.

FIG. 5A shows a state where the first sealant 210 is applied to an outer peripheral portion of the CF substrate 12.

<Application of Second Sealant 220>

As shown in FIG. 5A, the second sealant (FILL) 220 for forming the second sealing portion 22 is formed in a region (i.e., the display region) within the first sealant 210, which is applied to a surface of the CF substrate 12 so as to form a frame.

In this case, the second sealant 220 is dropped at a plurality of locations on the surface of the CF substrate 12 at intervals.

As a result, the second sealant 220 is applied within the first sealant 210. It is preferable that the first sealant 210 and the second sealant 220 be applied so as not to come into contact with each other immediately after application. Specifically, application quantities of the sealants and locations where the sealants are applied are adjusted. The second sealant 220 spreads towards an outer periphery of the CF substrate 12. If the second sealant 220 comes into contact with the first sealant 210 in a state where curing of the first sealant 210 has not progressed immediately after application, the second sealant 220 might penetrate through the first sealant 210 and flow out of the first sealant 210. By applying the first sealant and the second sealant such that the first sealant and the second sealant do not come into contact with each other immediately after application, the second sealant is prevented from flowing out of the first sealant.

The second sealant concentrically spreads outwards when the substrates are joined together. If the first sealant and the second sealant have already been in contact with each other when the second sealant concentrically spreads outwards, the second sealant might penetrate through the first sealant. Thus, by applying the first sealant 210 and the second sealant 220 such that the first sealant 210 and the second sealant 220 do not come into contact with each other before the substrates are joined together, the second sealant is further prevented from flowing out of the first sealant.

The second sealant 220 is, for example, an UV curable acrylic resin, an UV curable epoxy resin, and a thermosetting epoxy resin.

The second sealant 220 is applied by using a dispenser while setting the viscosity of the second sealant 220 at the time of application (initial viscosity) to 50 mPa·s to 1000 mPa·s so as to be lower than the viscosity of the first sealant 210, and, in particular, to 100 mPa·s to 500 mPa·s, considering a material spreading degree and adhesion.

In the present embodiment, a colorless, transparent UV curable epoxy resin having a viscosity of approximately 400 mPa·s is used on the assumption that the top-emission type organic EL display panel is manufactured.

An application quantity of the second sealant per drop is in a range of 0.2 µL to 2.0 µL, and an application quantity of the second sealant per inch is 28 $mm^3$ to 280 $mm^3$, for example.

The second sealant 220 as applied has fluidity, but is held within the frame formed by the first sealant 210 as the second sealant 220 is enclosed by the first sealant 210.

Although an example in which the sealants are applied to the CF substrate 12 has been described in the present embodiment, the sealants may be applied to the EL substrate 11.

<Start of Curing>

Curing reaction is initiated by irradiating the sealants 210 and 220 with UV light.

Figure 5B:
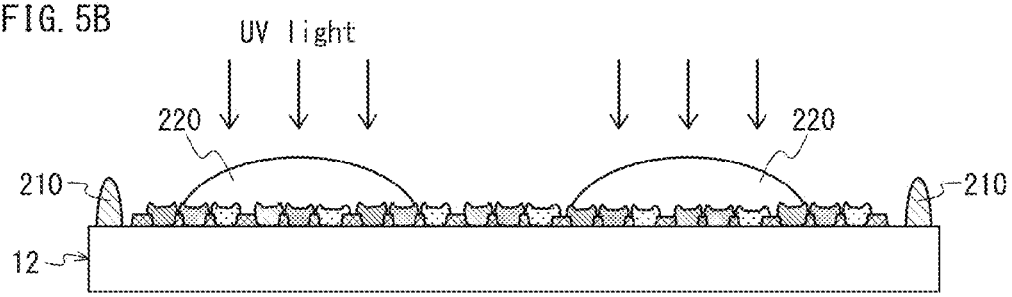

UV irradiation of the sealants 210 and 220 may be performed after application of the sealants 210 and 220 to the CF substrate 12 is completed as shown in FIG. 5B, or may be performed while the sealants 210 and 220 are being dropped.

Curing reaction of the sealants 210 and 220 is usually initiated upon UV irradiation of the sealants 210 and 220. However, there is a delay time between a start of curing reaction and progression of curing.

In the present embodiment, curing of the sealants 210 and 220 progresses rapidly after the CF substrate 12 and the EL substrate 11 are joined together before a viscosity curve (a curve showing the relationship between the time and the viscosity) of the sealants 210 and 220 rises sharply.

<Superimposition of Substrates>

Figure 5C:
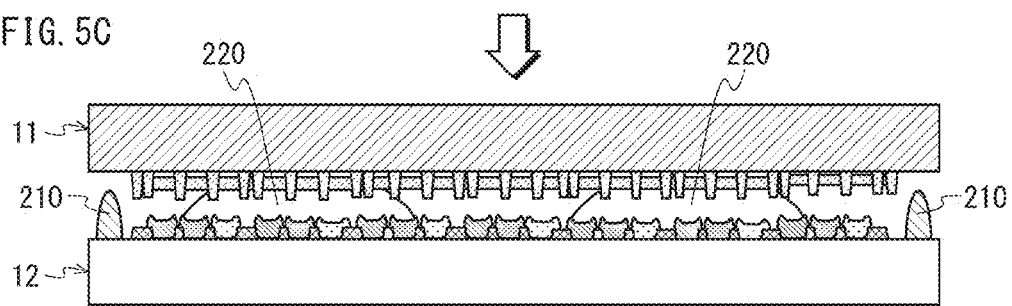

After the first sealant 210 and the second sealant 220 are applied, and curing reaction is initiated as described above, the EL substrate 11 and the CF substrate 12 are aligned with each other, and superimposed one on the other as shown in FIG. 5C.

Here, a time from a start of UV irradiation to joining is set to be equal to or longer than 30% of the pot life (a time until viscosity of the sealant before UV irradiation is doubled) of one of the first sealant 210 and the second sealant 220. In addition, the time from the start of UV irradiation to joining is set to be equal to or shorter than 60% of the pot life of one of the first sealant and the second sealant (i.e., to be equal to or shorter than 60% of the pot life of one the first sealant and the second sealant having a shorter pot life).

Superimposition of the substrates is performed in a vacuum chamber (of 10 Pa or lower, for example).

In this case, it is preferable that a spacer be interposed between the EL substrate 11 and the CF substrate 12 to set a distance between the substrates to a predetermined distance. The EL substrate 11 and the CF substrate 12 can accurately be aligned with each other by forming alignment marks on each of the substrates in advance. Vacuum drawing may be performed after alignment is completed.

Next, the EL substrate 11 and the CF substrate 12 are pressed by using a mechanical press so that the first sealant 210 and the second sealant 220 are squashed.

The second sealant 220 spreads in a space between the EL substrate 11 and the CF substrate 12, and is tightly fit into the space.

In this case, since the first sealant 210 that has a higher viscosity than the second sealant 220 and has a frame-like shape exists so as to enclose the second sealant 220, the second sealant 220 is prevented from flowing outwards.

By pressing the EL substrate 11 and the CF substrate 12, the space between the EL substrate 11 and the CF substrate 12 is filled with the first sealant 210 and the second sealant 220, and the second sealant 220 is confined by the first sealant 210 enclosing the second sealant 220.

Nitrogen is then introduced into the vacuum chamber to return a vacuum to atmospheric pressure, so that the EL substrate 11 and the CF substrate 12 are pressed by an equal force (differential pressure between the atmospheric pressure and the vacuum). As a result, the second sealant 220 spreads across a region within the first sealant 210. Further, since the first sealant 210 and the second sealant 220 press against each other at an interface therebetween, the first sealant 210 and the second sealant 220 are interlocked with each other at or around the interface.

Here, the second sealant 220 has a lower viscosity than the first sealant 210. Thus, the second sealant 220 enters into the first sealant 210 to form a dendritic portion.

The EL substrate 11 and the CF substrate 12 are left as they stand in a state where a distance between the EL substrate 11 and the CF substrate 12 is set to a predetermined distance (e.g. 20 μm), so that curing reaction of the first sealant 210 and the second sealant 220 progresses.

Figure 5D:
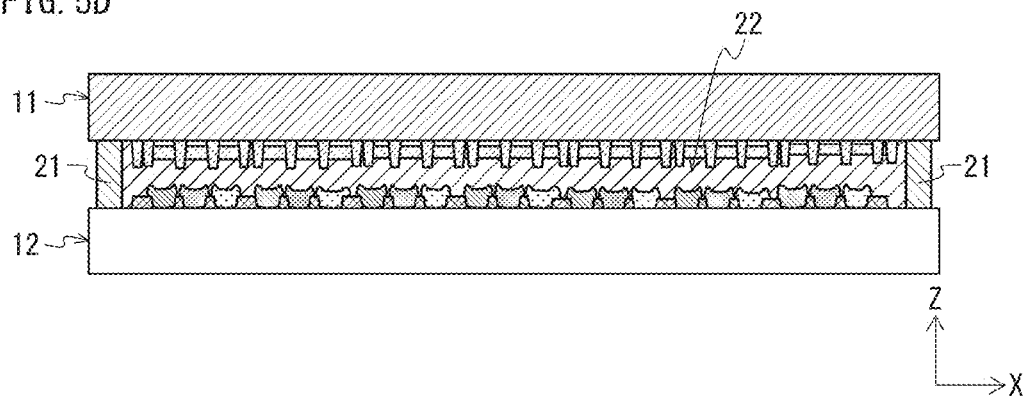

When the first sealant 210 and the second sealant 220 are cured, the first sealing portion 21 and the second sealing portion 22 are formed as shown in FIG. 5D, and joining is completed.

The aforementioned interlocked structure remains at or around the interface 24 between the first sealing portion 21 and the second sealing portion 22, and the dendritic portion 23 is formed in the first sealing portion 21.

The display panel 10 is completed in the above-mentioned manner.

(Effects Produced by Display Panel 10)

In the present embodiment, the display panel 10 includes the first sealing portion 21, the second sealing portion 22 formed within the first sealing portion 21, as well as the dendritic portion being a branched extension of the second sealing portion that extends into the first sealing portion. The dendritic portion can improve the bonding strength between the first sealing portion 21 and the second sealing portion 22, and improve the strength of the sealing resin layer, compared to the sealing resin layer having no dendritic portion between the first sealing portion and the second sealing portion. The dendritic portion can also distribute stress caused between the first sealing portion 21 and the second sealing portion 22.

With this structure, when stress is caused in the display panel, for example, the first sealant and the second sealant are less likely to be separated, and reduction of the sealing properties of the sealing resin layer can be suppressed. Reduction in life of the display panel can thus be suppressed.

The following describes one example of a case where stress is caused in the display panel.

When the first sealant and the second sealant are separated at the interface therebetween, a void can be produced between the first sealant and the second sealant.

When the void is produced at the interface between the first sealing portion and the second sealing portion, stress is caused at the void, as the void is in a decompressed state as in an environment during joining, whereas the outside of the panel is under the atmospheric pressure.

Although the case where stress is caused between the first sealant and the second sealant when the void is produced between the first sealant and the second sealant has been described as one example, the case where stress is caused is not limited to the above-mentioned case. Stress can also be caused by deflection of the display panel.

When the first sealant 210 and the second sealant 220 are made of different materials, stress is likely to be caused between the first sealing portion 21 and the second sealing portion 22. For example, a difference in coefficient of linear expansion and thermal expansion and a degree of curing and contraction between resins can cause stress at the interface between the first sealing portion 21 and the second sealing portion 22 after completion of the panel.

When the substrate bends, stress is also likely to be constantly caused in a panel after completion of the panel. This is because, if a bubble remains between the first sealant and the second sealant, the bubble is under vacuum, and atmospheric pressure is constantly applied from outside the panel.

Further, a difference in modulus of elasticity between the first sealant and the second sealant leads to a difference in the amount of deformation under pressure. The stress can cause separation between the first sealant and the second sealant.

To address the problem, the display device pertaining to the aforementioned aspect includes the dendritic portion being a branched extension of the second sealing portion that extends into the first sealing portion. The dendritic portion is formed by a material for the second sealing portion entering into the first sealing portion. That is to say, the first sealing portion and the second sealing portion are interlocked with each other at or around the interface therebetween, and thus the bonding strength between the first sealing portion and the second sealing portion is increased by the anchor effect. Thus, reduction of the sealing properties of the sealing resin layer can be suppressed.

More specifically, the increase in the bonding strength between the first sealing portion and the second sealing portion can suppress distortion of the substrates, which is caused by stress applied to the substrates due to the difference in degree of contraction between the substrates during curing, for example. Thus, a void is less likely to be produced between the first sealing portion and the second sealing portion.

Furthermore, a bonding area of the first sealing portion and the second sealing portion is increased, and thus stress caused in the display panel can be distributed more effectively.

Moisture, gas, and the like might enter from the outside into a region in which the light-emitting elements are formed via an interface between the first sealing portion and the dendritic portion when the dendritic portion reaches the outer periphery of the first sealing portion 21, and via the second sealant 220 when the second sealant 220 is made of a material having lower sealing properties than the first sealant 210.

In the present embodiment, a tip (an outermost end) of the dendritic portion is located within the outer periphery of the first sealing portion. With this structure, moisture and oxygen are less likely to enter into a light-emitting region from the outside (from the outer periphery of the first sealing portion).

Figure 6:
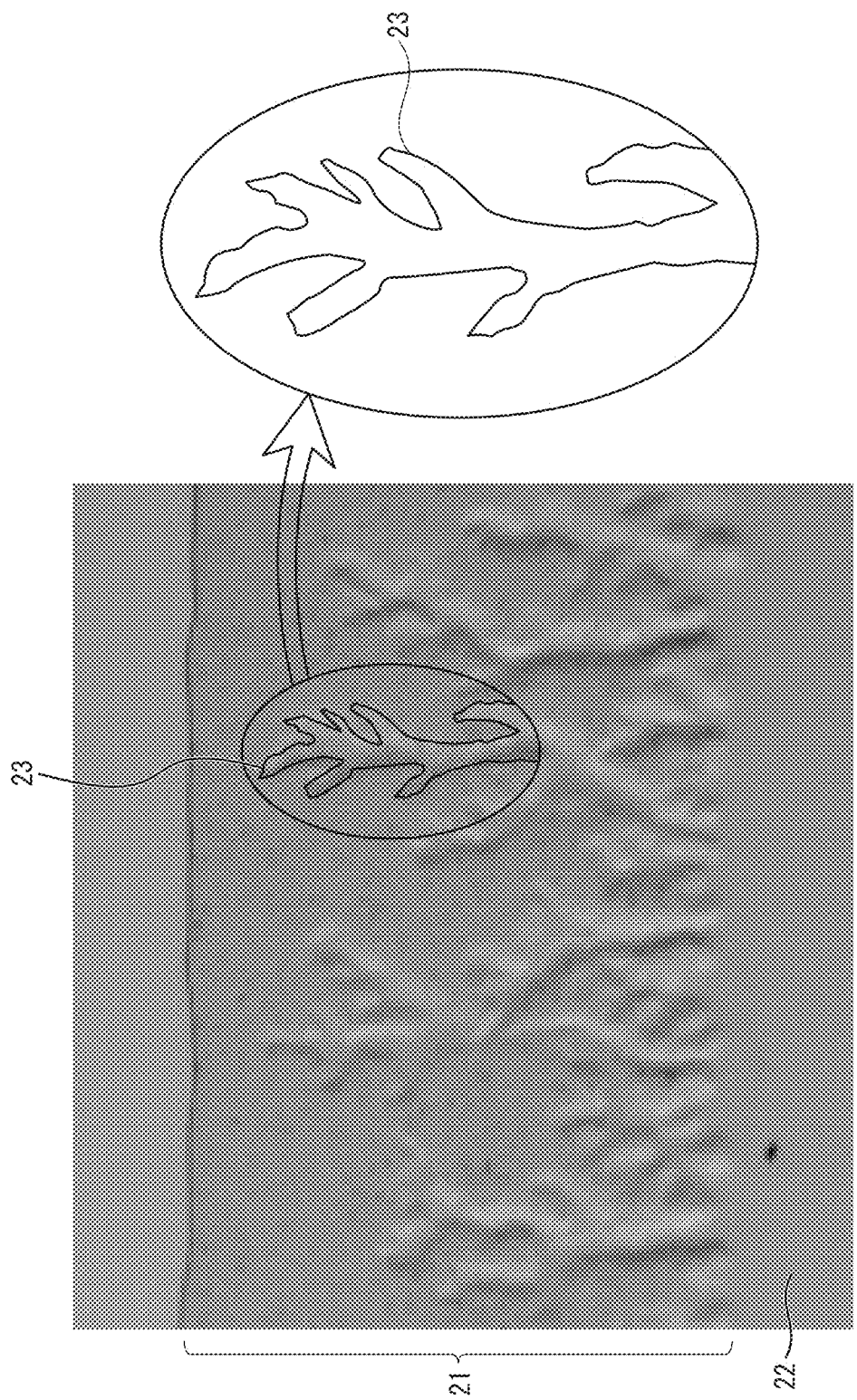
FIG. 6 is a photograph and an illustration showing that the second sealing portion enters into the first sealing portion to form a dendritic portion.

FIG. 6 is a photograph showing the dendritic portion 23 as actually formed, and an illustration showing the shape of the dendritic portion 23. In FIG. 6, the second sealing portion 22 enters into the first sealing portion 21 to form the dendritic portion 23. That is to say, the first sealing portion 21 and the second sealing portion 22 are interlocked with each other at or around the interface therebetween.

In FIG. 6, a root of the dendritic portion 23 is located at a lower side of the drawing. An upper side of FIG. 6 corresponds to the outer peripheral portion of the display panel 10.

As shown in FIG. 6, the dendritic portion 23 as a whole extends towards the outside of the display panel 10, and branches of the dendritic portion 23 also extend towards the outside of the display panel 10.

The size of the dendritic portion 23 is not particularly limited. In order to improve adhesion even when the display panel becomes larger, however, the dendritic portion 23 preferably enters into the first sealing portion 21 by 10% or more than the thickness of the first sealing portion.

Further, the dendritic portion 23 preferably enters into the first sealing portion 21 by 50% or more than the width of the first sealing portion 21. For example, when the first sealing portion 21 has a width of 1 mm, the dendritic portion 23 preferably extends by 0.5 mm or more in the width direction of the first sealing portion 21.

Meanwhile, the tip of the dendritic portion 23 preferably does not reach the outer periphery of the first sealing portion 21. This is because, if the tip of the dendritic portion 23 reaches the outer periphery of the first sealing portion 21, the dendritic portion 23 penetrates through the first sealing portion 21 to cause washout of the first sealing portion 21, and the sealing properties that the first sealing portion 21 originally has are reduced.

In FIG. 6, the dendritic portion 23 extends into the first sealing portion 21, but does not reach the outer periphery of the first sealing portion 21. As a result, washout of the first sealing portion 21 is not caused, and the sealing performance of the first sealing portion 21 is maintained.

In the present embodiment, the second sealing portion 22 is made of a material having a higher modulus of elasticity and higher sealing properties than the first sealing portion. Compared to a case where the second sealing portion 22 is made of the same material as the first sealing portion 21, the sealing properties of the sealing layer can be improved.

(Effects of the Aforementioned Manufacturing Method)

Since the process of initiating curing by irradiating the sealants with UV light is performed before the joining process, the sealants applied to the substrate are directly irradiated with UV light.

In addition, as described above, a time from the UV light (not limited to UV light as long as energy for curing the sealants is imparted) irradiation process to the joining process is set to be longer than 17% of the pot life of one of the first sealant 210 and the second sealant 220 and to be equal to or shorter than 60% of the pot lives of both of the first sealant 210 and the second sealant 220.

With this structure, production of a void between the first sealing portion 21 and the second sealing portion 22 after the joining process is suppressed, and the dendritic portion being a branched extension of the second sealing portion that extends into the first sealing portion, and having a tip located within the outer periphery of the first sealing portion can be formed.

Further, by setting the time from the UV light irradiation process to the joining process to be equal to or longer than 30% of the pot life of one of the first sealant 210 and the second sealant 220, good sealing properties of the sealing resin layer can be maintained when the first sealing portion 21 is formed as two frames, since the tip of the dendritic portion is located within the outer periphery of the inner frame part.

Conditions under which the dendritic portion 23 is formed without causing washout of the first sealing portion 21 are supported by the following experiments.

Experiment 1

Test panels were produced by joining two transparent substrates together while varying the pot life of each of the first sealant (sealant) 210 and the second sealant (filler) 220 and a time from UV irradiation to joining.

That is to say, the experiment was conducted on panels manufactured by using an UV curable epoxy resin having a pot life of 30 minutes as the first sealant 210 and the second sealant 220, and by setting the time from UV light irradiation to joining of the element substrate and the opposite substrate to 5 minutes (17% of the pot life), 9 minutes (30% of the pot life), 18 minutes (60% of the pot life), and 21 minutes (70% of the pot life).

The "pot life" herein refers to a time from impartation of curing energy for curing a resin until viscosity of the resin before impartation of the curing energy is doubled. The aforementioned "curing energy" is UV light in the present embodiment. When a thermosetting resin is used, the "curing energy" is heat.

The thickness of each of the substrates used in this experiment is 0.5 mm. The thickness of each of the substrates may be 0.5 mm to 0.7 mm.

The first sealant (sealant) is applied so as to have a cross section of 15000 $um^2$, and an application quantity of the second sealant (filler) per inch is 56 min'.

The first sealant 210 is applied so as to form two frames, and a distance between an inner frame part and an outer frame part is set to be approximately 2 mm.

UV irradiation was performed by using a metal halide lamp as a light source while maintaining a substrate temperature of 50° C. or lower.

In each of the panels thus manufactured, the inner frame part 21a located on the inner peripheral portion of the panel and the outer frame part 21b located on the outer peripheral portion of the panel are formed as shown in FIGS. 4B-4D. The shape of each of the panels at or around the interface between the first sealing portion 21 and the second sealing portion 22 was observed.

FIGS. 7A-7D and 8A-8D are photographs showing portions of the panels at or around the interfaces between the first sealing portions 21 and the second sealing portions 22. Specifically, FIGS. 7A and 7B show portions of panels obtained when joining is performed after a lapse of 17% of the pot life, FIGS. 7C and 7D show portions of panels obtained when joining is performed after a lapse of 30% of the pot life, FIGS. 8A and 8B show portions of panels obtained when joining is performed after a lapse of 60% of the pot life, and FIGS. 8C and 8D show portions of panels obtained when joining is performed after a lapse of 70% of the pot life.

According to the results shown in FIGS. 7A and 7B, a material for the second sealing portion 22 flows out of the inner frame part 21a and is further about to flow out of the outer frame part 21b, so that the first sealing portion 21 is on the verge of washout. The results suggest that the substrates should be joined together after a lapse of 17% of the pot life of one of the first sealant and the second sealant.

Such results were produced presumably because the substrates were joined together in a state where the curing reaction of the first sealant 210 had not sufficiently progressed, and the viscosity of the first sealant 210 was low.

When the substrates were joined together before the lapse of 17% of the pot life, a resin material for the first sealing portion and a resin material for the second sealing portion only went into a mixed (compatible) state, and no dendritic portion was observed.

According to the results shown in FIGS. 7C, 7D, 8A, and 8B, the second sealing portion 22 enters into the first sealing portion 21 to form the dendritic portions 23 without causing washout of the first sealing portion 21. Thus, favorable evaluation results were obtained.

According to the results shown in FIGS. 8C and 8D, the dendritic portion 23 is not formed in the inner frame part 21a. Such results were produced presumably because the curing reaction of the first sealant 210 had already progressed before joining.

The results of the experiment in a case where the first sealant 210 and the second sealant 220 each have a pot life of 30 minutes have been described so far. Similar results were obtained in cases where the first sealant and the second sealant each have a pot life of 10 minutes or 20 minutes. In summary, in cases where the pot lives of the first sealant and the second sealant are 10 minutes and 10 minutes, 20 minutes and 20 minutes, and 30 minutes and 30 minutes, respectively, a dendritic portion was formed without causing washout when the substrates were joined together after a lapse of 30% to 60% of the pot life of each of the first sealant and the second sealant from UV irradiation.

The above-mentioned results of study suggest that a condition under which the dendritic portion 23 is formed without causing washout of the first sealing portion 21 when the first sealant and the second sealant have an equivalent pot life is that the substrates are joined together after a lapse of 30% to 60% of the pot life of each of the first sealant and the second sealant from UV irradiation.

A case where the first sealant and the second sealant have different pot lives is considered next.

A typical function of the first sealant (DAM) is to block the flow of the second sealant. Especially when the second sealant is made of a more liquid (less viscous) material than the first sealant, the second sealant is required to be blocked by the first sealant. In addition, the second sealant is required to be distributed throughout each pixel region. It is therefore preferable to set the pot life of the first sealant to be equal to or shorter than the pot life of the second sealant.

In view of the above, the relationship between a time until joining is performed relative to the pot life and formation of the dendritic portion when the first sealant has a shorter pot life than the second sealant was considered.

Specifically, whether any dendritic portions are formed or not was observed by using the first sealant having a pot life of 10 minutes and the second sealant having a pot life of 30 minutes, and by setting the time from UV irradiation to joining to 5 minutes, 8 minutes, 10 minutes, and 12 minutes.

Figure 10A:
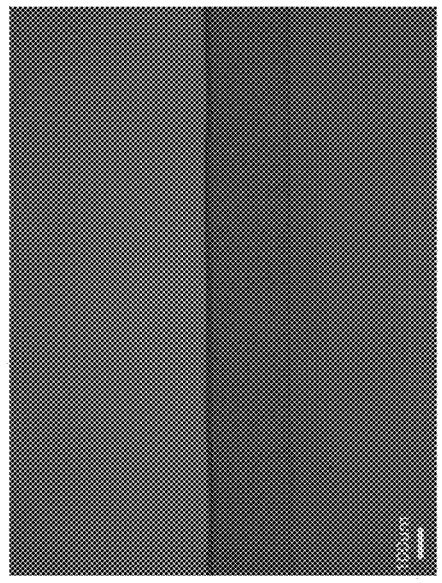
FIGS. 10A, 10B, 10C, and 10D are photographs showing results of Experiment 1.
Figure 10B:
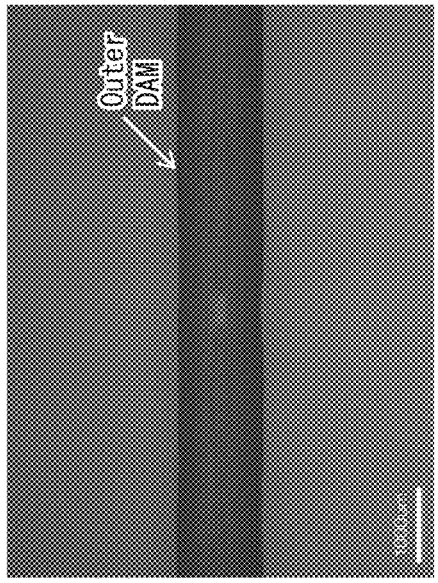
Figure 10C:
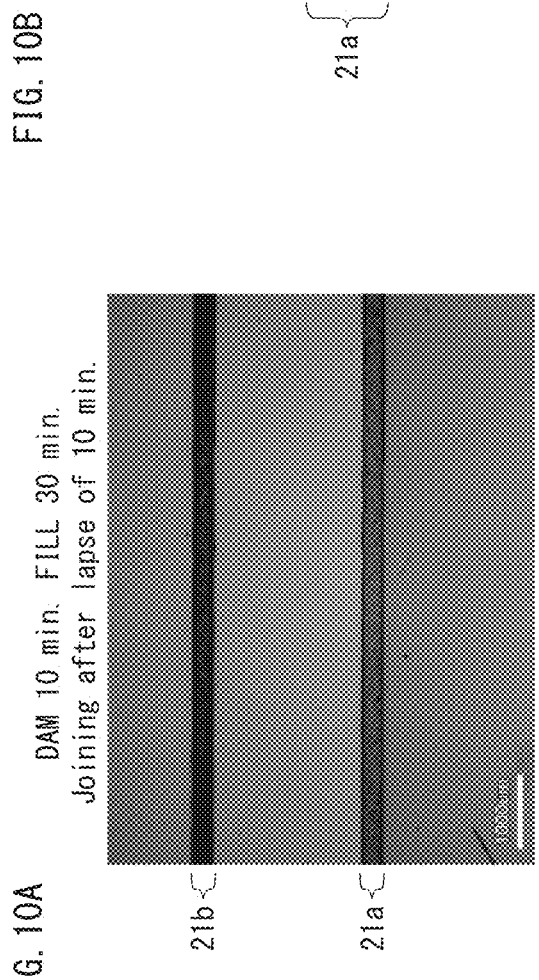
Figure 10D:
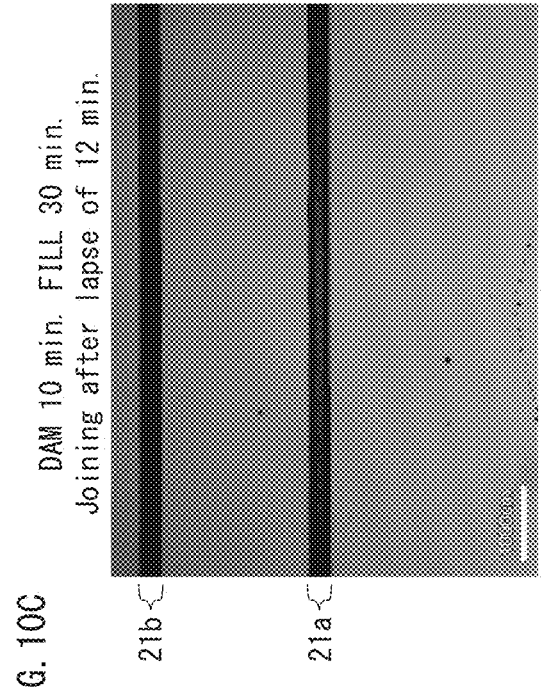

FIGS. 9A, 9B, 9C, 10A, 10B, 10C, and 10D show results of observation. FIG. 9A shows a case where joining is performed after a lapse of 5 minutes (50% of the pot life of the first sealant, and 17% of the pot life of the second sealant), FIGS. 9B and 9C show cases where joining is performed after a lapse of 8 minutes (80% of the pot life of the first sealant, and 27% of the pot life of the second sealant), FIGS. 10A and 10B show cases where joining is performed after a lapse of 10 minutes (100% of the pot life of the first sealant, and 33% of the pot life of the second sealant), and FIGS. 10C and 10D show cases where joining is performed after a lapse of 12 minutes (120% of the pot life of the first sealant, and 40% of the pot life of the second sealant).

A viscosity increase rate can vary depending on the zero point of the surrounding atmosphere. For example, the viscosity increase rate can differ under the atmosphere and under $N_2$ atmosphere due to differences of moisture and oxygen in the air. Therefore, it is preferable that viscosity measurement and panel joining be performed under the same surrounding atmosphere.

Dendritic portions are formed in FIG. 9A, but no dendritic portion is formed in FIGS. 9B, 9C, 10A, 10B, 10C, and 10D.

That is to say, dendritic portions are formed in the case where joining is performed after a lapse of 50% of the pot life of the first sealant, but no dendritic portion is formed in the cases where joining is performed after a lapse of 80% or more of the pot life of the first sealant.

The above-mentioned results suggest that dendritic portions are formed when joining is performed after a lapse of 60% or less of the pot life of the first sealant having a shorter pot life than the second sealant, and no dendritic portion is formed when joining is performed after a lapse of 80% or more of the pot life of the first sealant.

That is to say, dendritic portions are presumably formed when joining is performed when curing of one of the first sealant and the second sealant having a shorter pot life has not already progressed. It is therefore considered that, when the second sealant has a shorter pot life than the first sealant, dendritic portions are formed when joining is performed after a lapse of 60% or less of the pot life of the second sealant.

When a curing retarding resin is used in the sealant, it is generally considered to be preferable that the substrates be joined together at or around a time when a pot life of the sealant has lapsed to prevent reduction of sealing properties, which is caused by the second sealant flowing out of the first sealant. However, when the substrates are joined together at or around the time when the pot life has lapsed to bring the first sealant and the second sealant into contact with each other, dendritic portions are not formed in the first sealant as described above. In the present embodiment, two substrates are joined together before a lapse of 60% of the pot life of one of the first sealant and the second sealant made of a resin material having a shorter pot life from irradiation of the resin material with UV light.

Concerning conditions under which washout of the first sealing portion is caused when the first sealant and the second sealant have different pot lives, it is considered that washout is not caused when curing of one of the first sealant and the second sealant has progressed to some extent.

Further, as described above, when the first sealant and the second sealant have the same pot life, washout is not caused when joining is performed after a lapse of 30% or more of the pot life of each of the first sealant and the second sealant. It is therefore considered that washout is not caused when the joining is performed after a lapse of 30% or more of the pot life of one of the first sealant and the second sealant.

That is to say, it is considered that washout is not caused when joining is performed after a lapse of 30% or more of the pot life of one of the first sealant and the second sealant having a shorter pot life.

Specifically, when the first sealant has a shorter pot life than the second sealant, for example, when the pot lives of the first sealant and the second sealant are 10 minutes and 30 minutes, 10 minutes and 20 minutes, and 20 minutes and 30 minutes, respectively, it is considered that washout is not caused when joining is performed after a lapse of 30% or more of the pot life of the first sealant. The same applies to a case where the second sealant has a shorter pot life than the first sealant. For example, when the pot lives of the first sealant and the second sealant are 30 minutes and 10 minutes, 20 minutes and 10 minutes, and 30 minutes and 20 minutes, respectively, it is considered that washout is not caused when joining is performed after a lapse of 30% or more of the pot life of the second sealant.

The aforementioned considerations are supported by Experiment 2 shown below.

Experiment 2

By using eight combinations of first sealants having pot lives of 10 minutes, 20 minutes, and 30 minutes, and second sealants having pot lives of 10 minutes, 20 minutes, and 30 minutes, joining was performed after a lapse of 5 minutes from irradiation of the sealants with UV light, and states of portions of panels at or around interfaces between the first sealants and the second sealants were observed.

The other conditions in Experiment 2 are similar to those in Experiment 1 described above.

FIGS. 11A, 11B, 12A, 12B, 13A, 13B, and 14 show the states of the first sealing portions and the second sealing portions as observed.

The results are as follows.

Levels 1-3 are combinations of the first sealant and the second sealant that has an equivalent pot life to the first sealant, Levels 4-6 are combinations of the first sealant and the second sealant that has a longer pot life than the first sealant, and Levels 7-8 are combinations of the first sealant and the second sealant that has a shorter pot life than the first sealant.

The percentages in parentheses indicate a ratio of a time until joining is performed to the pot life.

Level 1: combination of the first sealant having a pot life of 10 minutes (50%) and the second sealant having a pot life of 10 minutes (50%)

Figure 11A:
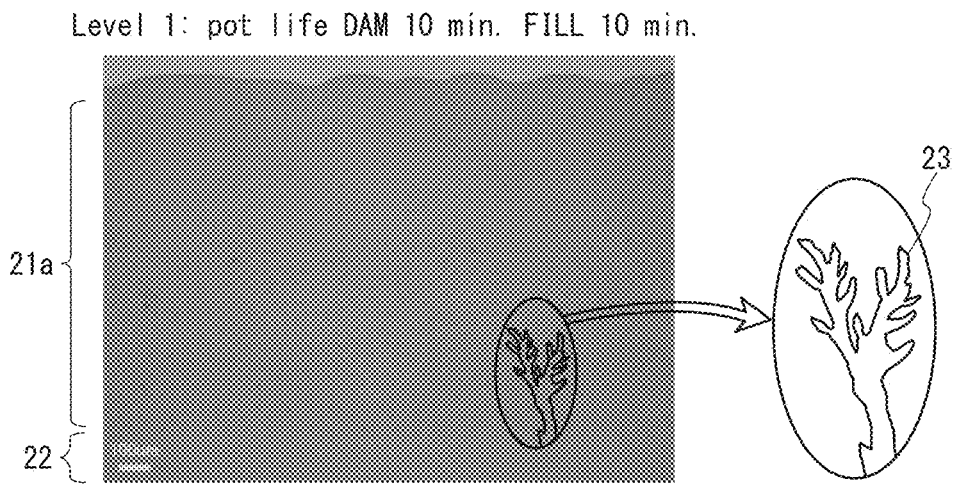
FIGS. 11A and 11B are photographs and illustrations showing results of Experiment 2.

As shown in FIG. 11A, dendritic portions were formed, and washout of the first sealing portion 21 was not observed.

Level 2: combination of the first sealant having a pot life of 20 minutes (25%) and the second sealant 220 having a pot life of 20 minutes (25%)

Figure 11B:
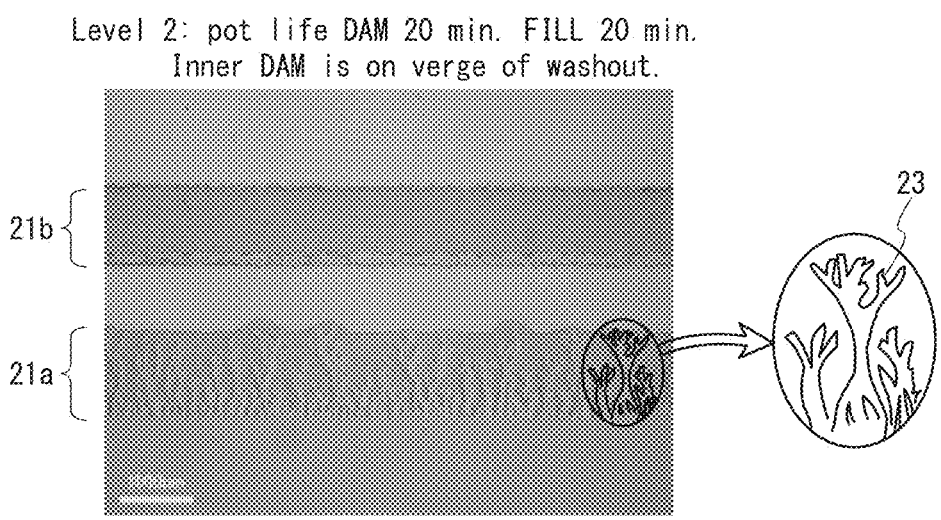

As shown in FIG. 11B, dendritic portions 23 were formed, but a material for the second sealing portion 22 penetrated through the inner frame part 21a to cause washout of the inner frame part 21a.

Level 3: combination of the first sealant having a pot life of 30 minutes (17%) and the second sealant having a pot life of 30 minutes (17%)

Figure 12A:
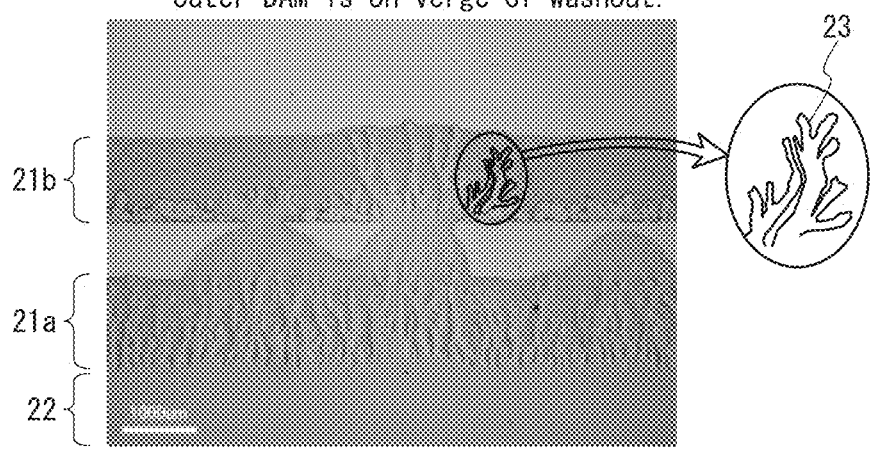
FIGS. 12A and 12B are photographs and illustrations showing results of Experiment 2.

As shown in FIG. 12A, dendritic portions 23 were formed, but the second sealant penetrated through the inner frame part 21a and the outer frame part 21b, and the outer frame part 21b was on the verge of washout.

Level 4: combination of the first sealant having a pot life of 10 minutes (50%) and the second sealant having a pot life of 20 minutes (25%)

Figure 12B:
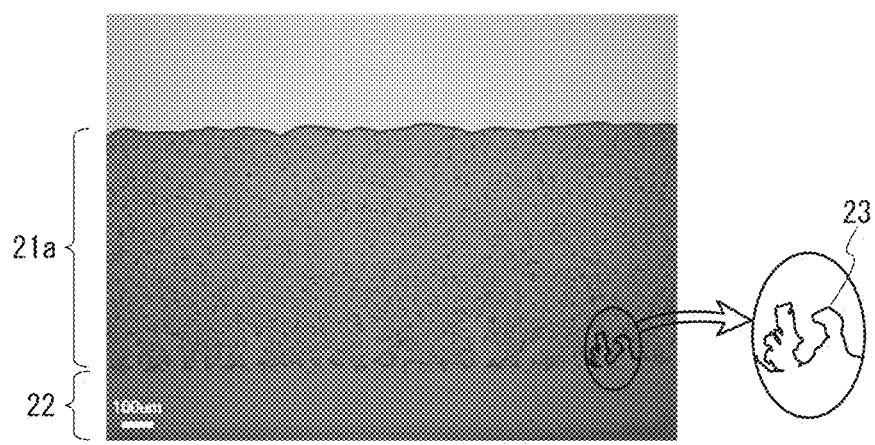

As shown in FIG. 12B, dendritic portions 23 were formed, and washout of the inner frame part 21a was not observed.

Level 5: combination of the first sealant having a pot life of 10 minutes (50%) and the second sealant having a pot life of 30 minutes (17%)

As shown in FIG. 9A, dendritic portions 23 were formed, and washout of the inner frame part 21a was not observed.

Level 6: combination of the first sealant having a pot life of 20 minutes (25%) and the second sealant having a pot life of 30 minutes (17%)

Figure 13A:
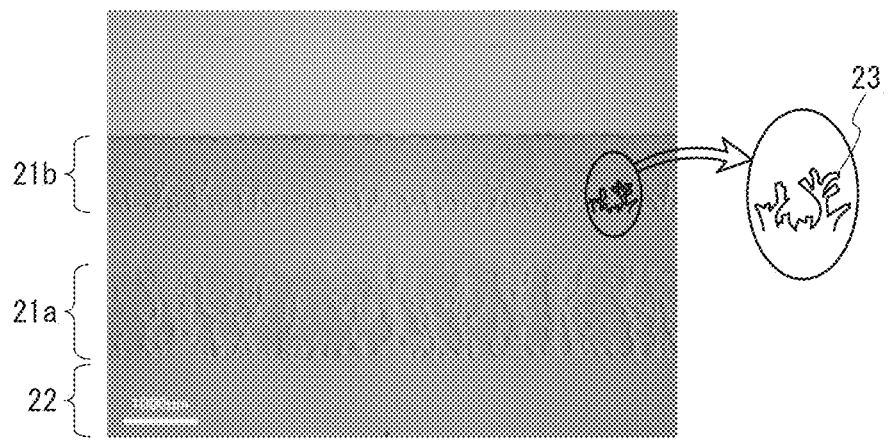
FIGS. 13A and 13B are photographs and illustrations showing results of Experiment 2.

As shown in FIG. 13A, dendritic portions 23 were formed, but the second sealant penetrated through the inner frame part 21a to cause washout of the inner frame part 21a, and the dendritic portions 23 extended into the outer frame part 21b.

Level 7: combination of the first sealant having a pot life of 20 minutes (25%) and the second sealant having a pot life of 10 minutes (50%)

Figure 13B:
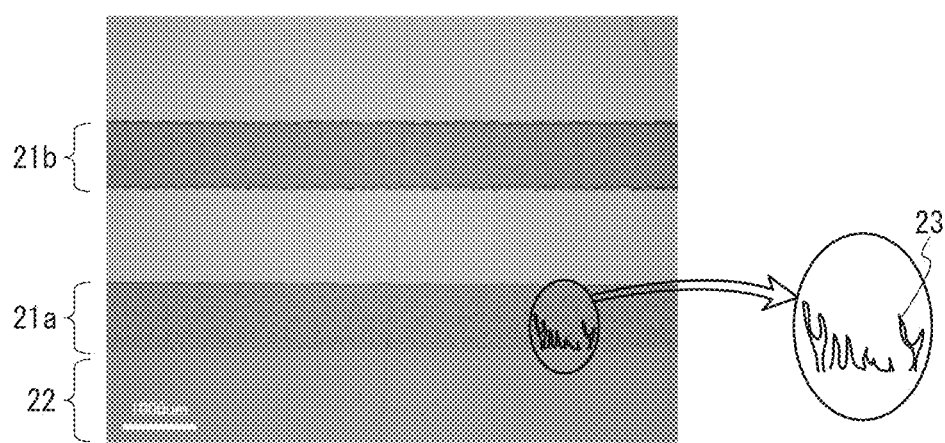

As shown in FIG. 13B, dendritic portions 23 were formed, and washout of the inner frame part 21a was not observed.

Level 8: combination of the first sealant having a pot life of 30 minutes (17%) and the second sealant having a pot life of 10 minutes (50%)

Figure 14:
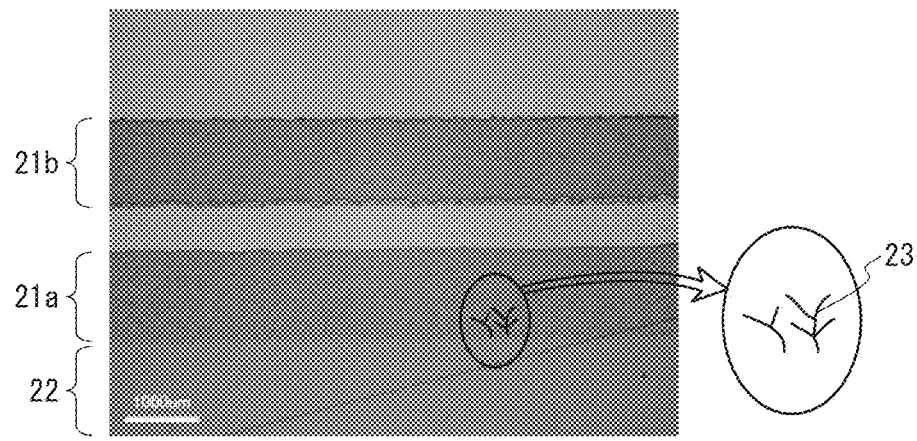
FIG. 14 is a photograph and an illustration showing a result of Experiment 2.

As shown in FIG. 14, dendritic portions 23 were formed, and washout of the inner frame part 21a was not observed.

As Level 9, a combination of the first sealant having a pot life of 30 minutes (17%) and the second sealant having a pot life of 20 minutes (25%) is considered.

In this combination, the first sealant has a longer pot life than that in Level 2 described above. Since washout is caused in Level 2 as described above, washout of the inner frame part 21a is expected to be caused in Level 9.

The results of observation of the states of the first sealant and the second sealant after joining for each combination of the pot life of the first sealant and the pot life of the second sealant are tabulated in Table 1.

TABLE 1

| | | second sealant | | |
|---|---|---|---|---|
| | pot life | 10 min. (50%) | 20 min. (25%) | 30 min. (17%) |
| first sealant | 30 min. (17%) | Level 8 no washout | Level 9 washout | Level 3 washout |
| | 20 min. (25%) | Level 7 no washout | Level 2 washout | Level 6 washout |
| | 10 min. (50%) | Level 1 no washout | Level 4 no washout | Level 5 no washout |

It is found, through verification and consideration of the results of Level 1-9, that washout of the inner frame part 21a is caused in cases where a time from UV irradiation to joining is equal to or shorter than 25% of the pot life of one of the sealants having a shorter pot life (Levels 2, 3, 6, and 9). It is also found that dendritic portions are formed without causing washout of the inner frame part 21a in cases where the time from UV irradiation to joining is 50% of the pot life of one of the sealants having a shorter pot life (Levels 1, 4, 5, 7, and 8).

As a result of consideration of the results in Experiments 1 and 2 above, it is found that a condition under which a dendritic portion can be formed and a condition under which washout is not caused are governed by the pot life of one of the first sealant and the second sealant having a shorter pot life.

That is to say, a dendritic portion is formed and washout of the first sealing portion is less likely to be caused when joining is performed after a lapse of 30% to 60% of the pot life of one of the first sealant and the second sealant having a shorter pot life.

Table 2 shows a time (a time from UV irradiation to joining) range in which a dendritic portion is formed without causing washout of the first sealing portion when the sealants are used for each of Levels described above.

TABLE 2

| | | second sealant | | |
|---|---|---|---|---|
| | pot life | 10 min. | 20 min. | 30 min. |
| first sealant | 30 min. | Level 8 3-6 min. | Level 9 6-12 min. | Level 3 9-18 min. |
| | 20 min. | Level 7 3-6 min. | Level 2 6-12 min. | Level 6 6-12 min. |
| | 10 min. | Level 1 3-6 min. | Level 4 3-6 min. | Level 5 3-6 min. |

The time range corresponds to 30% to 60% of the pot life of one of the first sealant and the second sealant having a shorter pot life.

<Modifications and Others>

In the above-mentioned manufacturing method, curing is initiated by UV irradiation of the first sealant and the second sealant. However, a thermosetting resin may be used as materials for the first sealant and the second sealant, and curing may be initiated by application of heat.

In the above-mentioned embodiment, an example in which the first sealant and the second sealant are made of different materials is shown. The first sealant and the second sealant, however, may contain the same material as a major component.

Further, the first sealant and the second sealant may contain the same material as a major component, and may contain different materials as the other components. The first sealant and the second sealant may contain the same resin material as a major component, and may contain different amounts of curing retarder. Further, the first sealant and the second sealant may contain the same resin material as a major component, and may contain different types and amounts of inorganic material.

The display panel 10 is not limited to the top-emission type display panel. The present invention can be implemented in a similar manner when the display panel 10 is of a bottom-emission type. The drive control unit 100 shown in FIG. 1 is just an example. The drive control unit is not limited to that shown in FIG. 1.

In the above-mentioned embodiment, an example in which the present invention is applied to the organic EL display device is shown. The present invention, however, is not limited to the organic EL display device, and may be applicable to a display device, including an inorganic EL display device, in which light-emitting elements are sealed by a sealing resin layer.

INDUSTRIAL APPLICABILITY

The present invention is applicable to a display device, such as an organic EL display device, in which substrates are joined together via a sealing resin layer, and can improve sealing properties of the sealing resin layer, thereby extending the life of the device.

REFERENCE SIGNS LIST 10 display panel
11 EL substrate
12 CF substrate
20 sealing resin layer
21 first sealing portion
21a inner frame part
21b outer frame part
22 second sealing portion
23 dendritic portion
23a dendritic portion
23b dendritic portion
111 TFT substrate
112 anode
113 bank
114 light-emitting layer
121 transparent substrate
101-104 drive circuit
122 color filter
123 BM
210 first sealant
211 inner periphery of first sealing portion 21
212 outer periphery of first sealing portion 21
213 inner periphery of inner frame part 21a
214 outer periphery of outer frame part 21b
220 second sealant

The invention claimed is:

1. A display device comprising:
an element substrate on which light-emitting elements are arranged, the light-emitting elements being arranged in a display region of the element substrate;
a sealing resin layer located over the light-emitting elements arranged on the element substrate; and
an opposite substrate located opposite the element substrate with the sealing resin layer therebetween, wherein the sealing resin layer includes:
a first sealing portion along an outer periphery of the display region, the first sealing portion having a frame-like shape;
a second sealing portion within the first sealing portion, the second sealing portion covering the display region; and
a dendritic portion being a branched extension of the second sealing portion that extends into the first sealing portion, and
a tip of the dendritic portion is located within an outer periphery of the first sealing portion.

2. The display device of claim 1, wherein
the first sealing portion is made of a first sealant,
the second sealing portion is made of a second sealant, and
the first sealant and the second sealant each contain a resin material as a major component.

3. The display device of claim 2, wherein
the first sealing portion is obtained by applying and curing the first sealant, and
the second sealing portion is obtained by applying and curing the second sealant.

4. The display device of claim 1, wherein
the first sealing portion includes:
an inner frame part enclosing an outer periphery of the second sealing portion; and
an outer frame part enclosing an outer periphery of the inner frame part.

5. The display device of claim 4, wherein
the dendritic portion extends into the inner frame part, and
the tip of the dendritic portion is located within the outer periphery of the inner frame part.

6. The display device of claim 4, wherein
the tip of the dendritic portion reaches the outer periphery of the inner frame part, and
a material for the second sealing portion extends into a region between the inner frame part and the outer frame part.

7. The display device of claim 6, wherein
the dendritic portion extends into the outer frame part, and
the tip of the dendritic portion is located within an outer periphery of the outer frame part.

8. The display device of claim 2, wherein
a time from a start of energy impartation until viscosity of the first sealant before energy impartation is doubled is shorter than a time from the start of energy impartation until viscosity of the second sealant before energy impartation is doubled.

9. The display device of claim 2, wherein
a time from a start of energy impartation until viscosity of the first sealant before energy impartation is doubled is approximately equal to a time from the start of energy impartation until viscosity of the second sealant before energy impartation is doubled.

10. The display device of claim 1, wherein
the opposite substrate includes a color filter in a region corresponding to the display region.

11. The display device of claim 1, wherein
the outer periphery of the first sealing portion is composed of straight lines connecting two adjacent vertex angles of the first sealing portion, which has the frame-like shape.

12. A method for manufacturing a display device that includes: an element substrate on which light-emitting elements are arranged; a sealing resin layer located over the light-emitting elements arranged on the element substrate; and an opposite substrate located opposite the element substrate with the sealing resin layer therebetween, the method comprising:

applying, to one of the element substrate and the opposite substrate, a first sealant so as to form a frame along an outer periphery of a display region, and a second sealant in a region within the first sealant;

curing the first sealant and the second sealant by imparting energy; and joining the element substrate and the opposite substrate together via the first sealant and the second sealant so that the element substrate and the opposite substrate are located opposite each other with the first sealant and the second sealant therebetween, wherein a time from a start of energy impartation to joining of the element substrate and the opposite substrate is longer than 17% and equal to or shorter than 60% of a time from the start of energy impartation until viscosity of one of the first sealant and the second sealant before energy impartation is doubled.

13. The method for manufacturing the display device of claim 12, wherein the time from the start of energy impartation to joining of the element substrate and the opposite substrate is equal to or longer than 30% of the time from the start of energy impartation until the viscosity of said one of the first sealant and the second sealant before energy impartation is doubled.

14. The method for manufacturing the display device of claim 12, wherein a time from a start of energy impartation until viscosity of the first sealant before energy impartation is doubled is shorter than a time from the start of energy impartation until viscosity of the second sealant before energy impartation is doubled.

15. The method for manufacturing the display device of claim 12, wherein a time from a start of energy impartation until viscosity of the first sealant before energy impartation is doubled is approximately equal to a time from the start of energy impartation until viscosity of the second sealant before energy impartation is doubled.

16. The method for manufacturing the display device of claim 12, wherein in applying the first sealant and the second sealant, the second sealant is applied after application of the first sealant.

17. The method for manufacturing the display device of claim 12, wherein in applying the first sealant and the second sealant, the first sealant and the second sealant are applied so as not to come into contact with each other.

18. The method for manufacturing the display device of claim 12, wherein in applying the first sealant and the second sealant, the first sealant and the second sealant are applied so as not to come into contact with each other before joining of the element substrate and the opposite substrate.

19. The method for manufacturing the display device of claim 12, wherein in applying the first sealant and the second sealant, the first sealant is applied so as to form at least two concentric frames.

* * * * *